(12) United States Patent
Medina Sanchez-Castro

(10) Patent No.: US 9,300,318 B1
(45) Date of Patent: Mar. 29, 2016

(54) SEGMENTED DAC

(71) Applicant: Analog Devices Global, Hamilton (BM)

(72) Inventor: Italo Carlos Medina Sanchez-Castro, Valencia (ES)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/725,323

(22) Filed: May 29, 2015

(51) Int. Cl.
| | |
|---|---|
| *H03M 1/66* | (2006.01) |
| *H03M 1/74* | (2006.01) |
| *H03M 1/00* | (2006.01) |
| *H03M 1/06* | (2006.01) |

(52) U.S. Cl.
CPC ............. *H03M 1/74* (2013.01); *H03M 1/002* (2013.01); *H03M 1/0609* (2013.01); *H03M 1/745* (2013.01); *H03M 1/00* (2013.01); *H03M 1/747* (2013.01)

(58) Field of Classification Search
CPC .................................. H03M 1/747; H03M 1/00
USPC ........................ 341/144, 145, 153, 133, 136
See application file for complete search history.

(56) References Cited

U.S. PATENT DOCUMENTS 6,621,439 B1 *  9/2003  Bugeja ................ H03M 1/0863
                                                                341/144

* cited by examiner

*Primary Examiner* — Joseph Lauture
(74) *Attorney, Agent, or Firm* — Kenyon & Kenyon LLP

(57) ABSTRACT

A Segmented Voltage Continuous-Time Digital-to-Analog Converter is disclosed which provides the benefits of segmentation while minimizing the associated disadvantages. The segmented digital to analog converter disclosed here features, in particular, inherent monotonicity and low transition glitches. The segmentation technique is based on coupling an array of switchable current sources and at least one current divider into a resistor string, providing, at least, three levels of segmentation.

24 Claims, 22 Drawing Sheets

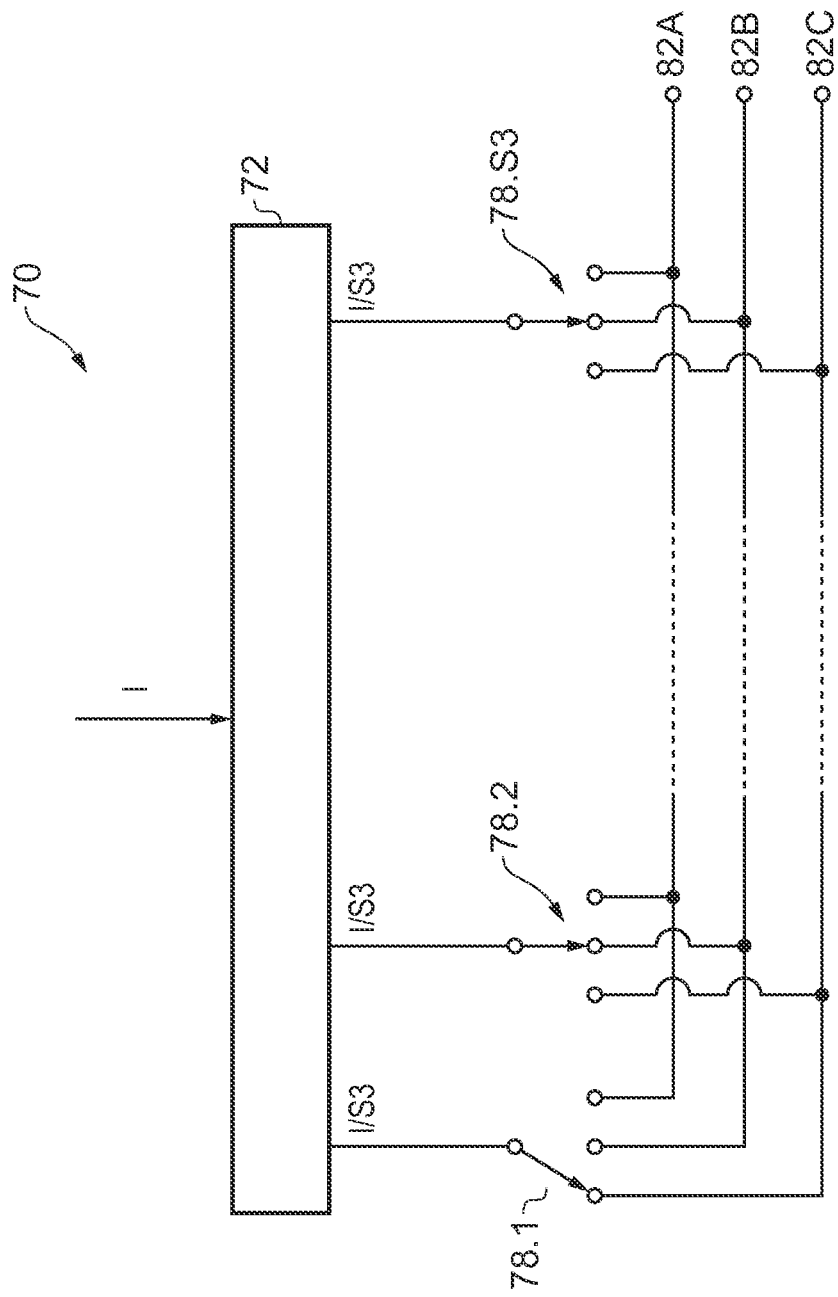

SEGMENTED DAC

FIELD OF THE DISCLOSURE

This disclosure relates to a segmented Digital-to-Analog Converter (DAC). In a first variation, the segmented DAC has a resistor string as main sub-DAC. In a second variation, a current source array or equivalent takes the role of the main sub-DAC.

BACKGROUND

It is known that, in general, when the resolution of a Digital to Analog Converter, DAC, is increased, i.e. the number of digital bits that it accepts in a digital input word increases, the space on a circuit, such as an integrated circuit, to implement the DAC also increases. Each extra bit can effectively double the size of a DAC.

Prior art attempts to reduce the size of DACs have involved "segmentation". Segmentation in the context of a Digital-to-Analog Converter (DAC) means dividing the digital input word of the DAC into several sub-words. The sub-words serve as the inputs for several segments of the DAC which can be regarded as sub-DAC's whose outputs are combined to generate the overall analog output of the DAC. This technique allows the component count and hence area consumed by the DAC components for a given resolution to be reduced and it is widely used for DACs whose resolution is beyond 10 bits. However, applying segmentation to a DAC produces side-effects which can negatively impact the performance of the resulting segmented DAC. Notably:

1) When the original DAC is inherently monotonic (the slope of the transfer function does not present a sign change for any input), which is a desirable feature, applying segmentation may involve losing the inherent monotonicity;

2) The dynamics of the resulting segmented DAC can be significantly worse than those associated with the original DAC, especially in terms of a transition glitch. It is desirable that transitions from one DAC code to another DAC code do not introduce too severe a glitch (both in terms of magnitude and duration) as this can adversely affect subsequent circuitry. The desirability of avoiding glitches during code transitions has generally limited attempts to provide segmented DACs to two levels of segmentation. In practice segmentation beyond two levels is generally perceived to exacerbate transition glitches, especially for transitions between segments. This has been an obstacle to working with more than two levels of segmentation.

Monotonic behavior (i.e. an increase in the digital input word always results in an increase in the analog output or more strictly the transfer function is entirely non-increasing or entirely non-decreasing, as appropriate, so for a sequence of increasing digital codes the output value should not have regions where it decreases interposed with regions where it increases) in a DAC is an important feature of operation.

SUMMARY

According to a first aspect of this disclosure there is provided a segmented digital to analog converter comprising first, second and third segments. The first segment comprises a plurality of impedances arranged in series. The second segment comprises a plurality of current sources or a current source associated with a current divider or current steering circuit, and the third segment comprises a current divider and current steering circuit. A controller is arranged to receive an input digital word and to provide first, second and third control words to the first, second and third segments, respectively, such that the first, second and third segments cooperate to provide an analog representation of the input digital word.

The segmented digital to analog converter may comprise more than three segments.

The provision of a controller to receive the input word and from that create at least the first, second and third words enables higher levels of segmentation, and hence a reduced component count to be realized. For implementations of the disclosure using integrated circuit techniques, this translates to a reduction in area on a semiconductor die, and hence a reduction in manufacturing cost. However the controller also allows the first, second and third words to be selected so as to maintain monotonicity.

In a first series of segmented digital to analog converters constituting embodiments of the present disclosure, a resistor string constitutes a primary sub-DAC that is the sub-DAC that converts the most significant bits of an input word. A plurality of current sources in association with current steering components, which can be regarded as forming a current source array, or a current source DAC, is used to convert bits of a middle or intermediate value or weight. A current divider in association with current steering components, which can be regarded as forming a current steering DAC, is used to convert the least significant bits of the input word. The current source DAC may be implemented as a current source in association with a current divider.

In a second series of digital to analog converters constituting embodiments of the present disclosure, a current source DAC constitutes the primary sub-DAC. The current steering DAC is used to convert the intermediate bits on the input word and the resistor string DAC is used to convert the least significant bits of the input word.

A common theme can be observed in that a current steering DAC follows the current source DAC in order of precedence or importance. This is because the current divider DAC receives current from the current source DAC and divides it.

BRIEF DESCRIPTION OF THE DRAWINGS

Embodiments of digital to analog converters in accordance with the teachings of this disclosure will be described, by way of non-limiting example only, with reference to the accompanying drawings, in which:

FIG. 4*a* shows an extension to the arrangement shown in FIG. 4;

DESCRIPTION OF SOME EXAMPLE EMBODIMENTS

Figure 1:
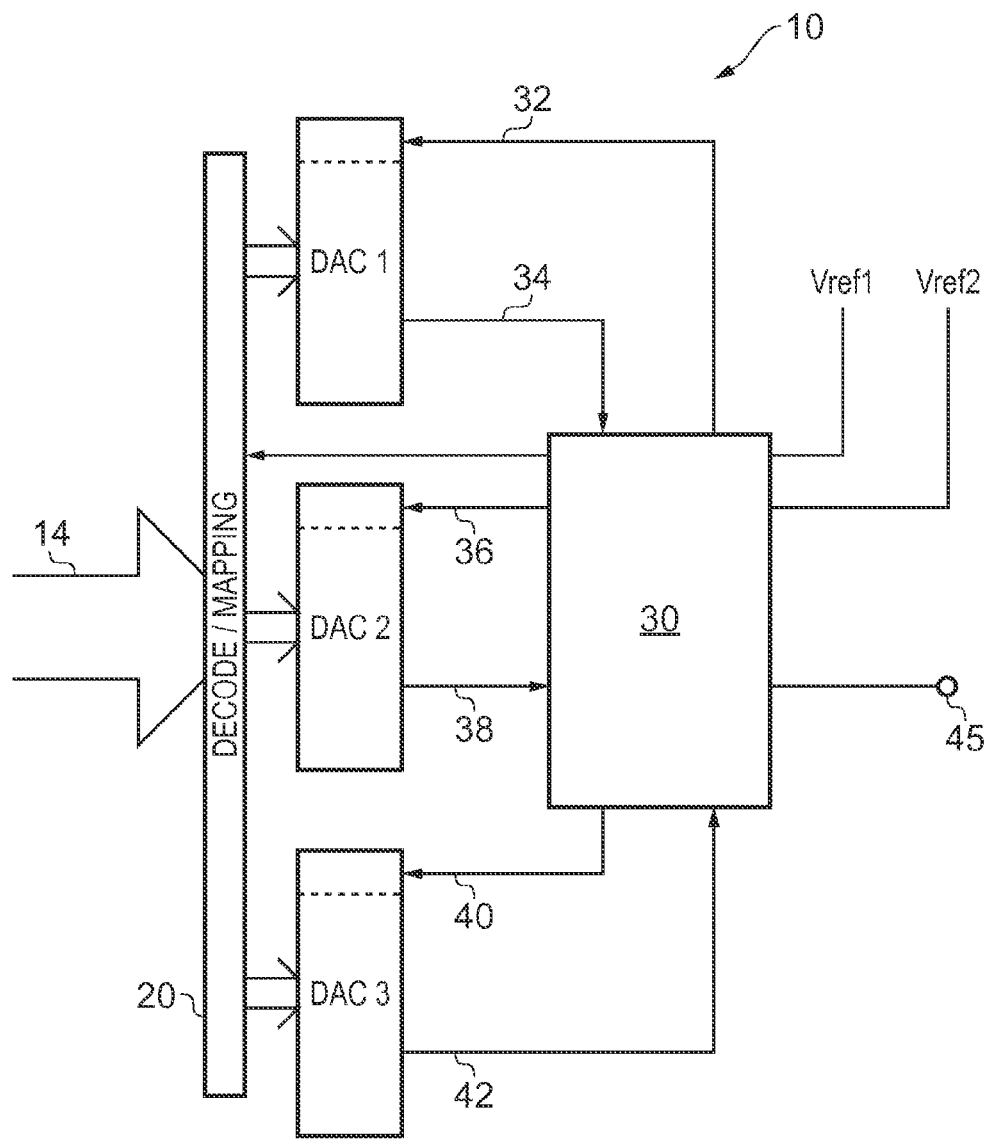
FIG. 1 is a block diagram of an embodiment of a digital to analog converter in accordance with the teachings of this disclosure.

Overview of Operation of a Segmented Digital to Analog Converter

Before considering the specific examples of the present disclosure it is worth considering the operation of a digital to analog converter.

An ideal linear voltage DAC accepts a digital input word $d_{IN}$ of N bits of resolution and an analog voltage reference $V_{REF}$, and generates an analog output voltage $V_{DAC}$ as described by equation 1:

$$V_{DAC} = d_{IN} \cdot \frac{V_{REF}}{2^N} = d_{IN} \cdot V_{LSB} \quad (1)$$

where $V_{LSB} = V_{REF}/2^N$ is the Least Significant Bit voltage and the decimal equivalent of the digital word is applied.

In the present disclosure, the DAC accepts an N bit digital input word having bits 0 to N−1, i.e. $d_{IN}[N-1:0]$. The N bit input word is divided into 3 or more sub-words. For convenience, the division into three sub-words will now be discussed in detail. The 3 sub-words are represented herein as $d_M$, $d_P$ and $d_L$, each of them having a length of M, P and L bits, respectively, with N=M+P+L. Each division of $d_{IN}$ represents a level of segmentation; thus, for three levels of segmentation:

The first level (associated to the sub-word $d_M = d_{IN}[N-1:P+L]$ of M bits) represents the most significant part of $d_{IN}$ and its weight in the transfer function (1), normalized to $V_{LSB}$, is $2^{N-M} = 2^{P+L}$.

The second level (associated to the sub-word $d_P = d_{IN}[P+L-1:L]$ of P bits) represents the partially significant part of $d_{IN}$ and its weight in the transfer function (1), normalized to $V_{LSB}$, is $2^{N-M-P} = 2^L$.

The third level (associated to the sub-word $d_L = d_{IN}[L-1:0]$ of L bits) represents the least significant part of $d_{IN}$ and its weight in the transfer function (1), normalized to $V_{LSB}$, is $2^{N-M-P-L} = 1$.

Consequently, $d_{IN}$ can be expressed as (where the decimal equivalent of the digital words is applied):

$$d_{IN} = 2^{P+L} \cdot d_M + 2^L \cdot d_P + d_L \quad (2)$$

Combining equations 1 and 2, the ideal transfer function $V_{DAC}(d_{IN})$ of the segmented DAC according to the basic form of the present disclosure can be represented as:

$$V_{DAC} = d_{IN} \cdot V_{LSB} = (2^{P+L} \cdot d_M + 2^L \cdot d_P + d_L) \cdot V_{LSB} \quad (3)$$

In the segmented architecture each segment is responsible for converting part of the input word, but the outputs of each segment need to be combined in an appropriate manner to give appropriate weight to each of the outputs derived from the segments.

Generalized Configuration of a Segmented DAC in Accordance with this Disclosure

FIG. 1 shows a DAC according to one embodiment of the present disclosure. The DAC generally indicated 10 receives an input word on an input bus 14. The input word is provided to a decode/mapping function 20 which can be implemented in hardware, software or a combination thereof. For the purposes of this disclosure it will be assumed that the mapping function is provided by a mapping circuit 20. The mapping circuit 20 is connected to first, second and third segments of the segmented DAC 10. Each segment is a sub-DAC, indicated in FIG. 1 as DAC1, DAC2 and DAC3. The connection between the mapping circuit 20 and the sub-DACs may be by suitable means such as respective data busses. However, in other variations the sub-DACs may be connected to a shared bus and the data provided to each sub-DAC may include an address identifying the sub-DAC that the next data word is intended for, or the sub-DAC may only be responsive to part of the bus.

Each of the sub-DACs are connected to one another by a fixed or a reprogrammable connection network represented here as a connection matrix 30. The connection matrix 30 provides analog signals to each sub-DAC and receives analog signals from each sub-DAC. The connection matrix 30 may, for example, receive first and second reference voltages Vref1 and Vref2 which may serve to delimit the output range of the DAC 10. These voltages may be used to derive other analog values such as intermediate voltages or intermediate currents. Furthermore the output from one sub-DAC may act as an input to another sub-DAC. In general the first sub-DAC DAC1 may receive at least one analog signal from the connection matrix 30 by way of one or more conductors, of which only one 32 is illustrated. One or more analog values may be provided from the first sub-DAC DAC1 to the connection matrix 30 by way of one or more conductors, of which only one 34 is shown for simplicity. Similarly connections 36 and 38 (which may represent multiple input and output connections) provide analog values to and receive them from the second sub-DAC DAC2 and connections 40 and 42 (which may represent multiple input and/or output connections) provide analog values to and receive them from the third sub-DAC 3. The connection matrix can be used to allow the order of precedence or importance of the SUB-DACs to be set by the user or manufacturer. However if the DAC 10 is not intended to be user reconfigurable then the connection matrix can be hard wired at manufacture, in which case the connection matrix is provided by the conductive tracks interconnecting the sub-DACs in a circuit such as an integrated circuit. An output value is provided at an output node 45.

In use, the decode and mapping circuit 20 examines the incoming word and determines what digital codes should be provided to the sub-DACs DAC1, DAC2 and DAC3.

Figure 2:
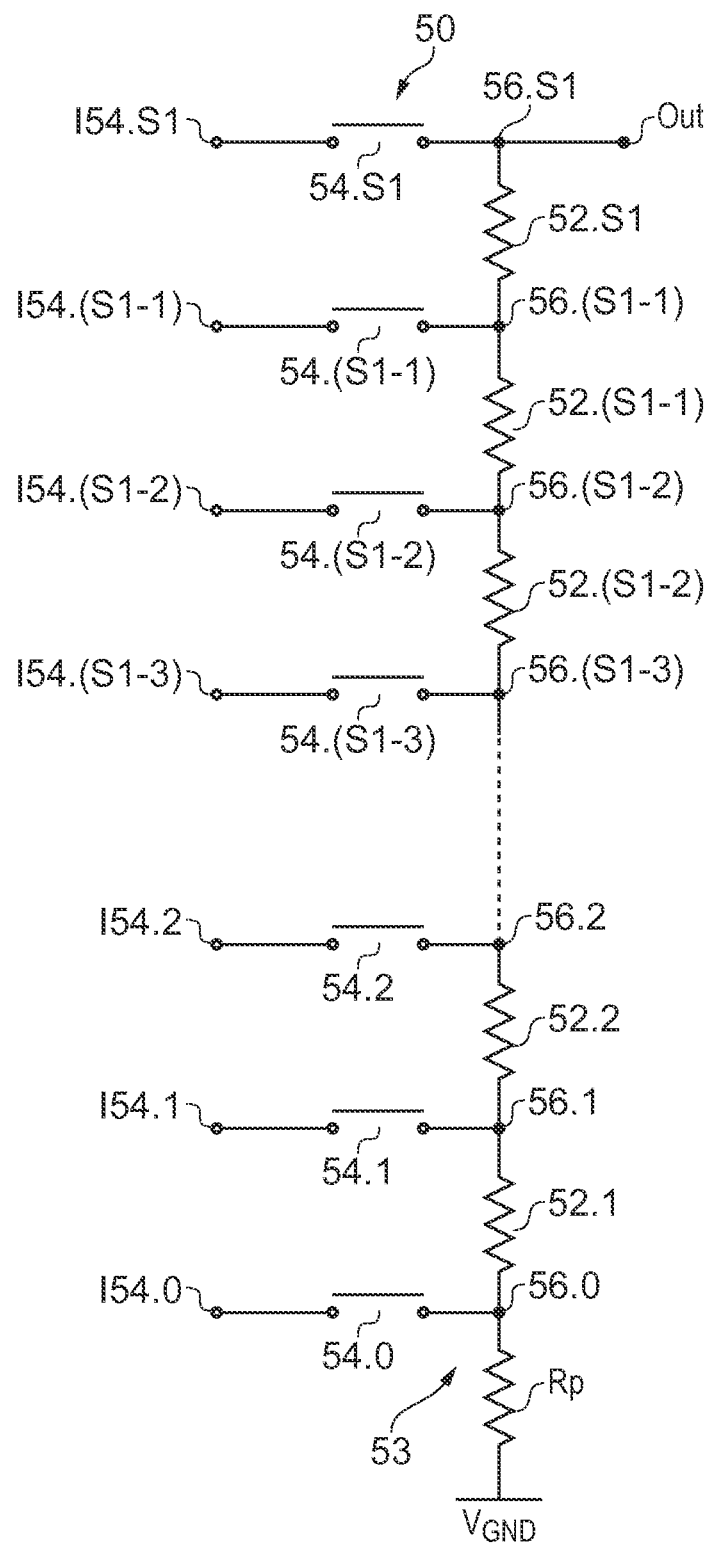
FIG. 2 is a circuit diagram of an embodiment of a first segment of the digital to analog converter in accordance with the teachings of this disclosure.

The technologies used to implement the sub-DACs may be varied. These will now be discussed, but no order of precedence should be inferred from the order that these items are discussed. FIG. 2 illustrates a first segment 50 comprising a plurality of resistances formed in series, and which can be regarded as being a resistor string 53. The resistances are illustrated as resistors 52.1 to 52.S1, although in practice several distinct resistors might cooperate to form each one of the resistances. Such an arrangement may be adopted to facilitate trimming of the DAC. For convenience it will be assumed that each resistance is embodied as a single resistor. Each of the resistors 52.1 to 52.S1 has first and second ends. A first end of the first resistor 52.1 forms a 0th node 56.0 of the resistor string 53. A 0th switch 54.0 is connected to the 0th node. A second end of the first resistor 52.1 is connected to a switch contact of the first switch 54.1 (such as the second switch contact when numbering from left to right in FIG. 2) and also to a first end of the second resistor 52.2 at a first node 56.1. Similarly the second end of the second resistor 52.2 is connected to the second switch 54.2 and to the third resistor 52.3 at a second node 56.2. This sequence of connections is continued along the resistor string with an Nth resistor being connected to an Nth switch and an N+1th resistor at an Nth node until the final resistor in the string is reached where the second end of the S1th resistor 52.S1 is connected to the second contact of the S1th switch 54.S1 and the S1th node and to an output node "out". The 0th node 56.0 is connected to a reference voltage $V_{GND}$. The connection may include a parasitic resistance Rp, which ideally would have a value of 0 Ohm.

Each of the switches 54.0 to 54.S1 has a respective input terminal 154.0 to 154.S1 which can be connected to other circuit elements in a way that will be described later. There is no restriction on the number of resistors that might be included in the resistor string, but for convenience S1 is generally a power of 2 such as $2^M$. The switches can conveniently be implemented by transistors, such as field effect transistors. For $2^M$ resistors that are $1+2^M$ nodes 56.0 to 56.2$^M$.

Figure 3:
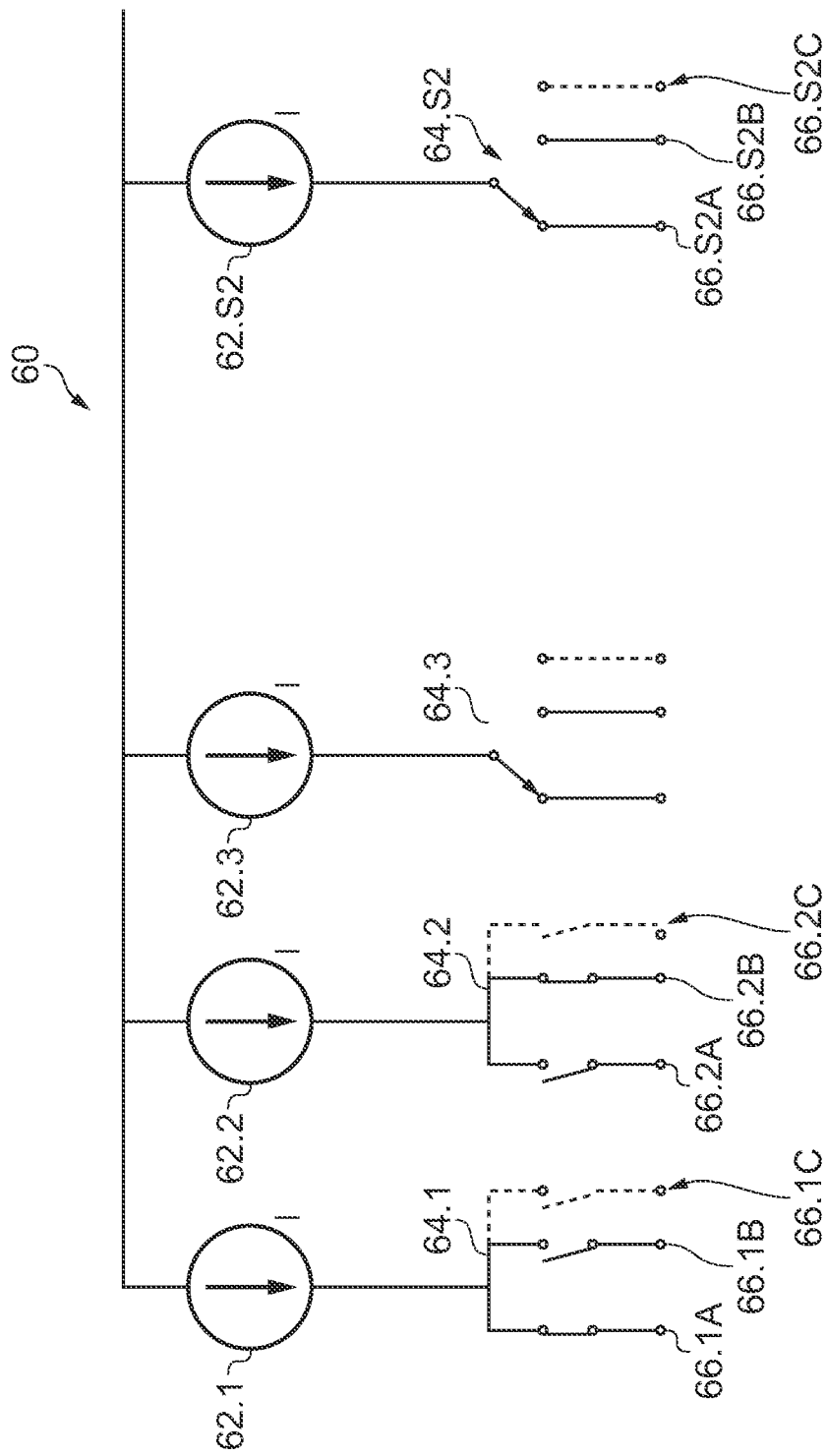
FIG. 3 is a circuit diagram of an embodiment of a second segment of the digital to analog converter in accordance with the teachings of this disclosure.

An embodiment of a second segment (which may also be referred to as a sub-DAC) is shown in FIG. 3. The second segment is generally designated 60 in FIG. 3 and comprises S2 current sources designated 62.1 to 62.S2 forming a current source array. Each of the current sources has a respective multiway switch 64.1 to 64.S2 or switches associated with it such that the current from each current source can be sent to one of at least two respective current nodes. Thus current source 62.1 can send its current to one of node 66.1A or 66.1B depending on the state of a control bit associated with switch 64.1 which as shown can be implemented by two switches (such as Field Effect Transistors, FETs) in parallel and driven such that, with the exception of a code transition phase, only one switch is conducting at a time. Similarly current source 62.2 can send its current to node 66.2A or node 66.2B depending on the state of a control bit for the second switch 64.2, and so on. As will be seen later, in some embodiments the individual currents can be steered to one of three output nodes, such as 66.1C, 66.2C and so on up to 66.S2C. This requires the provision of a three position switch. The switch may be implemented using transistors, such as FETs and a three position switch requires two binary bits to define its switch state.

There is no specific limit on the number S2 of current sources in the second segment, but for convenience S2=$2^P$.

Figure 4:
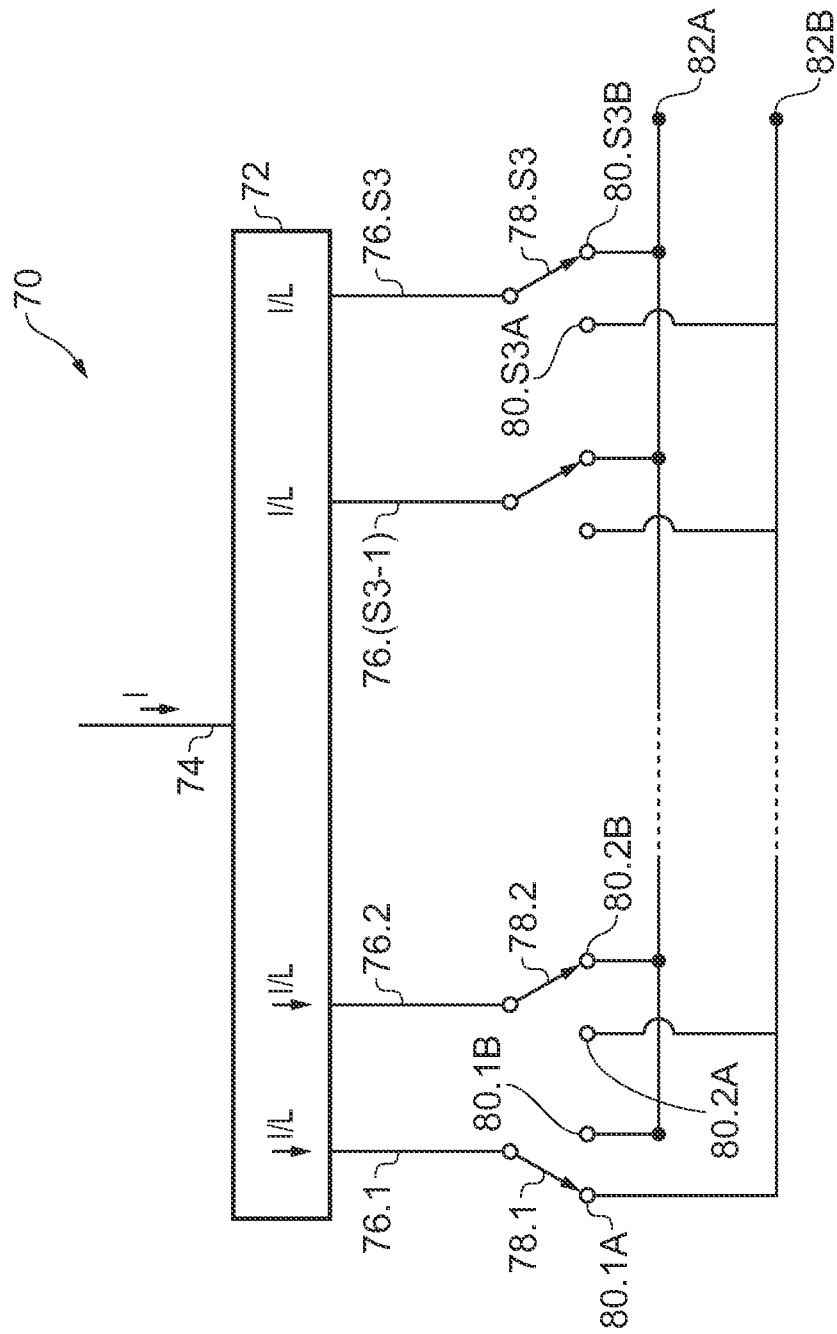
FIG. 4 is a circuit diagram of an embodiment of a third segment of the digital to analog converter in accordance with the teachings of this disclosure.

FIG. 4 is a circuit diagram of an embodiment of a third segment or sub-DAC. The third segment is generally designated 70 and comprises a current divider 72 which receives a current I at an input 74 and splits the current into S3 identical streams of value I/L where generally L=S3.

The individual divided currents are output from the outputs 76.1 to 76.S3 of the current divider 72, and provided to switches 78.1 to 78.S3 which, like the switches described with respect to the second sub-DAC, can direct the current from the associated current output to one of at least respective first and second output nodes. Thus the current from the first output 76.1 can be directed by the switch 78.1 to output node 80.1A or node 80.1B in response to a control bit associated with the first switch 78.1. Similarly current from the second output 76.2 can be directed to node 80.2A or 80.2B by switch 78.2, and so on. All of the "A" nodes are connected to a shared (common) node 82A. Similarly all of the "B" nodes are connected to a shared node 82B.

Although the circuit of FIG. 4 has been illustrated for simplicity as only allowing 2-way current steering, i.e. to node A or node B, each switch can be modified to allow multi-way current steering, for example to nodes A, B or C as shown in FIG. 4a.

Figure 5A:
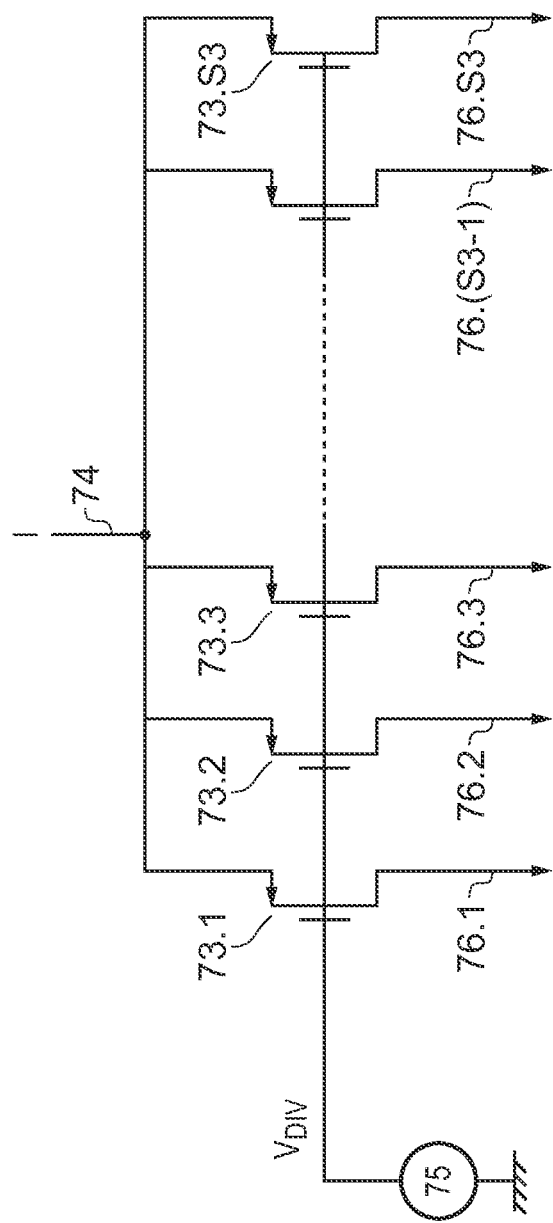
FIGS. 5*a* and 5*b* show embodiments of the current divider of FIG. 4 in greater detail.

In a preferred embodiment of the current divider 72 shown in FIG. 5a matched field effect transistors are arranged to split or divide the input current between them in such a way that the sum of the output currents from the current divider equals the input current. Such an arrangement is shown in FIG. 5a where a plurality of transistors, in this example P type MOSFETS 73.1 to 73.S3, have their sources connected to the input node 74, and their gates are connected in common to receive a bias voltage, $V_{DIV}$, from a reference voltage generator 75. The drains of the transistors form respective output nodes, so the drain of transistor 73.1 acts as the output 76.1, the drain of transistor 73.2 acts as the output 76.2 and so on. The transistors serve to pass nominally identical currents, and hence the input current I is divided equally between the transistors.

Figure 5B:
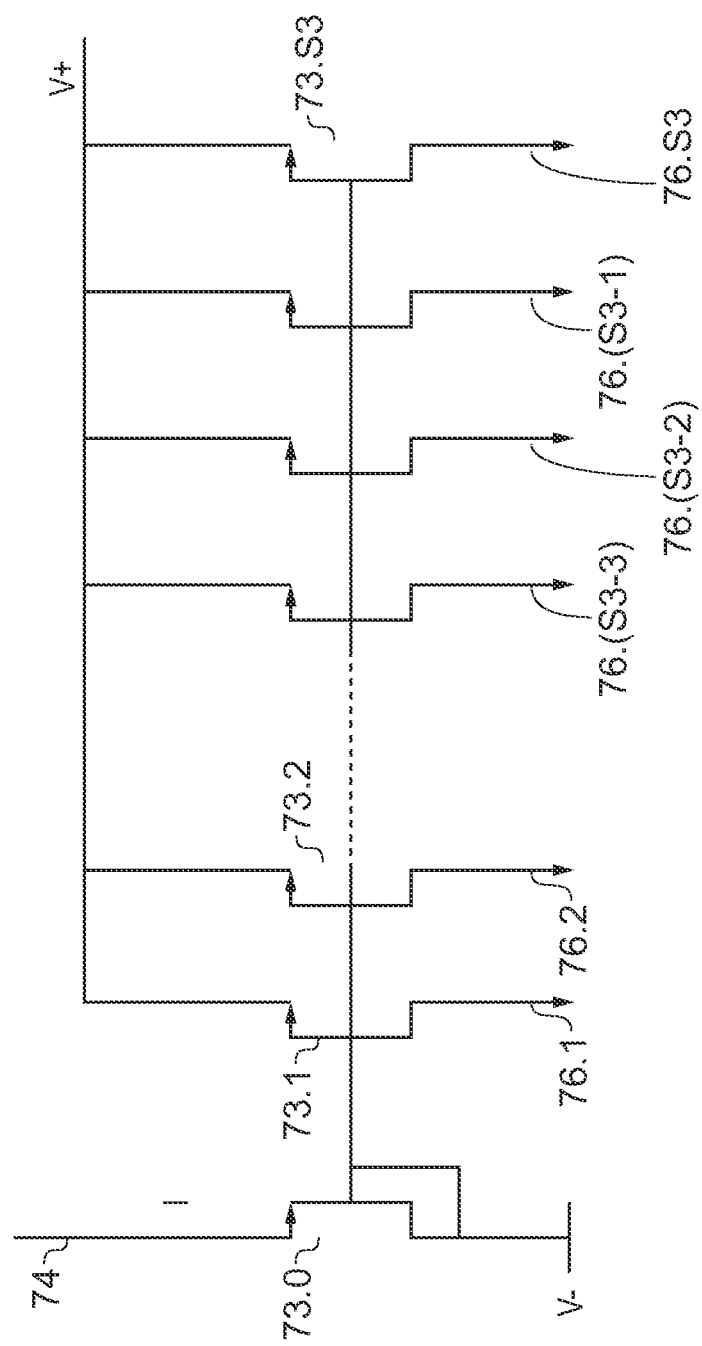

The person skilled in the art will appreciate that other variations are possible, although they may trade-off features such as current matching against voltage headroom. Such an alternative is shown in FIG. 5b, where current mirroring is used instead of directly dividing the current supplied to the current divider.

Description of A Family of DACs Having a Resistor String as the Main Sub-DAC

Having described some of the building blocks, in the form of three different structures for the first, second and third segments (Sub-DACs) respectively, ways of interconnecting them will now be described.

Figure 6:
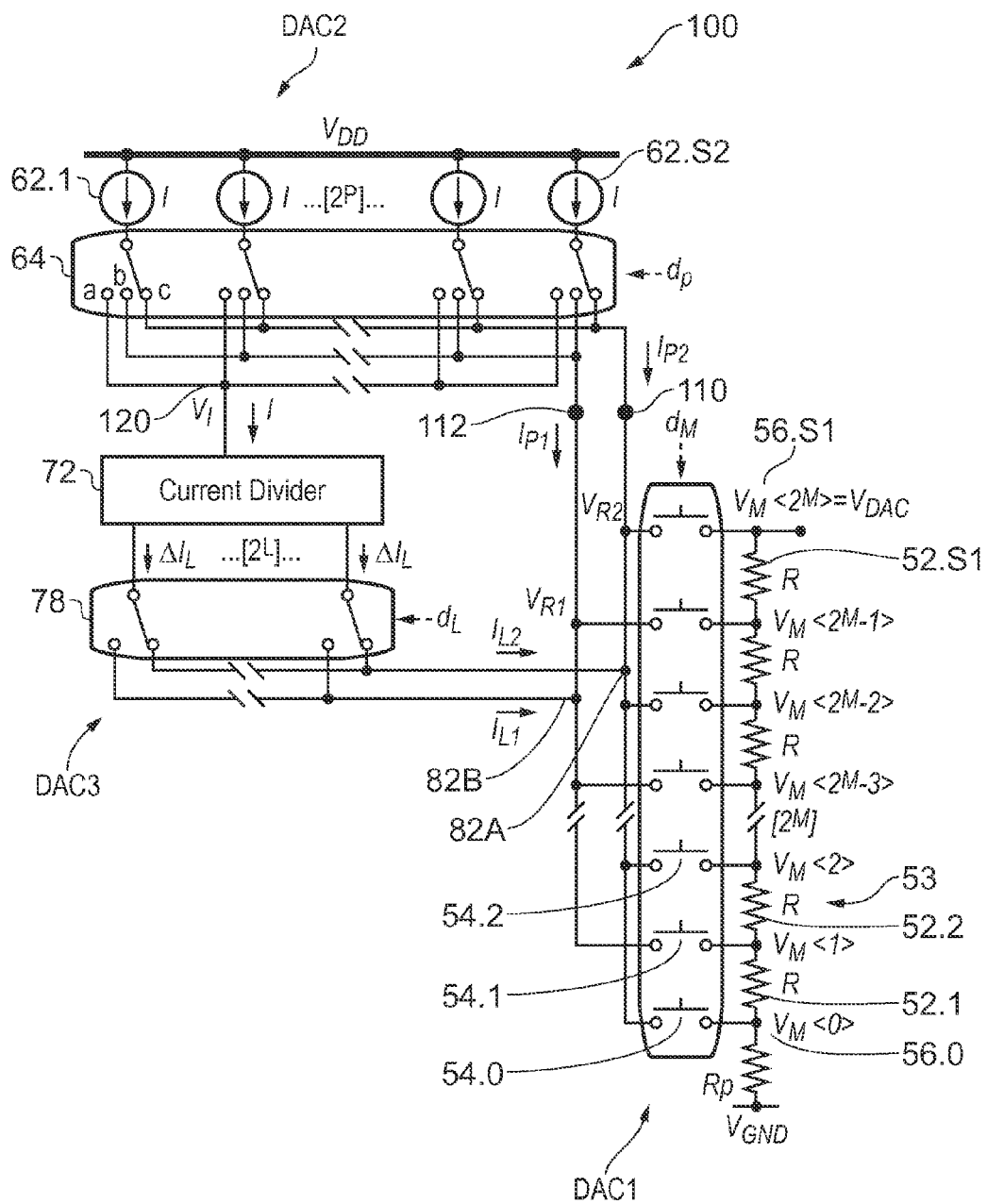
FIG. 6 is a circuit diagram of a DAC in accordance with this disclosure.

FIG. 6 shows a block diagram of a first embodiment of the DAC architecture 100, where three levels of segmentation as previously described can be recognized.

A first sub-DAC DAC1 is formed as a resistor string of $2^M$ matched resistors of nominal value R as described with respect to FIG. 2. This first sub-DAC constitutes the most significant sub-DAC. The first sub-DAC has its bottom terminal, node 56.0, coupled to a first reference voltage, which here is the ground potential $V_{GND}$ by a path which may include a parasitic resistance Rp. The uppermost node, Node 56.S1 of the resistor string 53 is connected to deliver an output of the DAC 100 as a voltage $V_{DAC}$ as a function of $d_{IN}$ (according, ideally, to equation 1). As a result, 2+1 different taps 56.0 to 56.S1 which can also be represented as $V_M<0>$ to $V_M<2^M>=V_{DAC}$ are provided as part of the resistor string.

Here the even numbered switches 54.0, 54.2, 54.4 associated with the zeroth, second, fourth and so on taps 56.0, $V_M<0>$; 56.2, $V_M<2>$; 56.4, $V_M<4>$ and so on are connected to a first shared node 110. The odd numbered switches 54.1, 54.3, 54.5, ($V_M<1>$, $V_M<3>$, etc.) for the first, third, fifth and so on taps are connected to a second shared node 112.

In use, the second DAC, DAC2 has in this example has S2 (S2=$2^P$) matched current sources each selectively connectable to one of three outputs. All of the first outputs designated "A" in FIG. 3, e.g. 66.1A, 66.2A, 66.3A and so on are connected to a first output node 120 of the second segment DAC2. Similarly all of the outputs designated "B", e.g. 66.1B, 66.2b etc. are connected to a second output node, which in this example is also the second shared node 112. All of the outputs designated "C" are connected to a third output node, which in this example is the first shared node 110.

The second DAC, DAC2 generates a total current of IS2, which is generally $2^P I$. An analog current $I_{P1}$ controlled by the status of the switches is injected into the node 112. Similarly, an analog current $I_{P2}$ controlled by the switches is injected into the node 110. The bank of 3-way switches controlled by $d_P$ and possibly $d_L$ further allows current to be selectively diverted to the node 120 which acts as an input terminal 74 of a third sub-DAC implemented, for example as a current divider as herein before described with respect to FIG. 4. The second sub-DAC may be implemented as a single current source and a current dividing DAC, as shown in FIG. 4.

The current divider based sub-DAC, DAC3 (which constitutes the least significant sub-DAC) has its first output node 82A connected to the first shared node 110, whereas the second output 82B is connected to the second shared node 112. The third segment (i.e., 3rd Sub-DAC) DAC 3 provides $2^L$ matched currents, each representing a $2^L$ way division of its input current, and it generates two output currents $I_{L1}$ and $I_{L2}$ to be added to the current flow from the second segment, i.e. second sub-DAC, DAC2, and converted into a voltage output by the first segment DAC1.

In normal operation, only one of the current sources 62-1 to 62-S2 is diverted to the input 120 of the current divider. Consequently, the nominal value of $\Delta I_L$ is:

$$\Delta I_L = \frac{I}{2^L} \quad (4)$$

The remaining current sources I are diverted to $I_{P1}$ or to $I_{P2}$; hence:

$$I_{P1} + I_{P2} = (2^P - 1) \cdot I \quad (5)$$

The divided currents $\Delta I_L$ output by the current divider are diverted to $I_{L1}$ or to $I_{L2}$; hence:

$$I_{L1} + I_{L2} = 2^L \cdot \Delta I_L = I \quad (6)$$

In normal operation, only two consecutive tap voltages $V_M\langle i\rangle$ and $V_M\langle i+1\rangle$ of the resistor string 53 are simultaneously turned on. Therefore, $I_{P1}$ and $I_{L1}$ are injected into the corresponding odd tap and, similarly, $I_{P2}$ and $I_{L2}$ are injected into the corresponding even tap. The taps turned on are selected based on $d_M$. Assuming that the index of the lower tap turned on is represented by the decimal equivalent of $d_M$, $V_{DAC}$ can be expressed by equation 7 if $d_M$ is odd, and by equation 8 when $d_M$ is even:

$$V_{DAC} = d_M \cdot R \cdot (I_{P1} + I_{P2} + I_{L1} + I_{L2}) + R \cdot (I_{P2} + I_{L2}),$$

$$d_M = 2 \cdot k + 1, k \in \{, \ldots, 2^{M-1} - 1\} \quad (7)$$

$$V_{DAC} = d_M \cdot R \cdot (I_{P1} + I_{P2} + I_{L1} + I_{L2}) + R \cdot (I_{P1} + I_{L1}),$$

$$d_M = 2 \cdot k, k \in \{0, \ldots, 2^{M-1}\} \quad (8)$$

In normal operation, the current $I_{P1}$, controlled by $d_P$, is given by (9), if $d_M$ is odd, and by (10), if $d_M$ is even (where the decimal equivalent of the digital words is applied):

$$I_{P1} = (2^P - 1 - d_P) \cdot I, d_M = 2 \cdot k + 1, k \in \{0, \ldots, 2^{M-1} - 1\} \quad (9)$$

$$I_{P1} = d_P \cdot I, d_M = 2 \cdot k, k \in \{0, \ldots, 2^{M-1}\} \quad (10)$$

In normal operation, the current $I_{P2}$, controlled by $d_P$, is given by equation 11, if $d_M$ is odd, and by equation 12 when $d_M$ is even:

$$I_{P2} = d_P \cdot I, d_M = 2 \cdot k + 1, k \in \{0, \ldots, 2^{M-1} - 1\} \quad (11)$$

$$I_{P2} = (2^P - 1 - d_P) \cdot I, d_M = 2 \cdot k, k \in \{0, \ldots, 2^{M-1}\} \quad (12)$$

Turning to consider the third segment, the current $I_{L1}$, controlled by $d_L$, is given by equation 13 if $d_M$ is odd, and by equation 14 when $d_M$ is even.

$$I_{L1} = (2^L - d_L) \cdot \frac{I}{2^L}, \quad d_M = 2 \cdot k + 1, \quad k \in \{0, \ldots, 2^{M-1} - 1\} \quad (13)$$

$$I_{L1} = d_L \cdot \frac{I}{2^L}, \quad d_M = 2 \cdot k, \quad k \in \{0, \ldots, 2^{M-1}\} \quad (14)$$

Similarly the current $I_{L2}$, controlled by $d_L$, is given by equation 15 if $d_M$ is odd, and by equation 16 when $d_M$ is even.

$$I_{L2} = d_L \cdot \frac{I}{2^L}, \quad d_M = 2 \cdot k + 1, \quad k \in \{0, \ldots, 2^{M-1} - 1\} \quad (15)$$

$$I_{L2} = (2^L - d_L) \cdot \frac{I}{2^L}, \quad d_M = 2 \cdot k, \quad k \in \{0, \ldots, 2^{M-1}\} \quad (16)$$

Substituting and combining equations 9, 11, 13 and 15 in equation 7 when $d_M$ is odd, or, analogously, equations 10, 12, 14 and 16 in equation 8, when $d_M$ is even, the same expression for $V_{DAC}$ is obtained (where the decimal equivalent of the digital words is applied):

$$V_{DAC} = d_M \cdot 2^P \cdot R \cdot I + d_P \cdot R \cdot I + d_L \cdot R \cdot \frac{I}{2^L} = \quad (17)$$

$$(2^{P+L} \cdot d_M + 2^L \cdot d_P + d_L) \cdot R \cdot \frac{I}{2^L}$$

Comparing equation 17 with the desired transfer function given by equation 3, $V_{LSB}$ can be identified as:

$$V_{LSB} = R \cdot \frac{I}{2^L} \quad (18)$$

Applying equation 18 in equation 17, the ideal transfer function (see equation 3) is obtained. Consequently, the DAC core architecture shown in FIG. 6 performs the expected DAC conversion with 3 levels of segmentation.

Effectively, all the multiples of $V_{LSB}$ between 0 and $(2^N - 1) \cdot V_{LSB}$ are obtainable by properly varying the control subwords $d_M$ ($0 \le d_M \le 2^M - 1$), $d_P$ ($0 \le d_P \le 2^P - 1$) and $d_L$ ($0 \le d_L \le 2^L - 1$). The output voltage $V_{DAC}$ of the DAC core 100 is generated by the combined ohmic effect, in the portion of the resistor string 53 established by $d_M$, of the previously described currents: $I_{P1}$ and $I_{P2}$, controlled by $d_P$, and $I_{L1}$ and $I_{L2}$, controlled by $d_L$.

A decoding circuit provided within the controller 20 (not shown in FIG. 6 but shown in FIG. 1) accepts the digital input word $d_{IN}$ and generates the control signals which drive the switches. Preferably, the operation of the decoding circuit and controller 20 is such that, once $d_L$ is maximum ($d_L=2^L-1$), the current source being divided is diverted directly to the string as part of $I_{P1}$ or $I_{P2}$ (increasing/decreasing $d_P$ by 1), the following current source in a predefined sequence is connected to the input 120 of the current divider 72, and all the outputs of the current divider are diverted to the tap where the current being divided now was previously. Once $d_P$ is maximum/minimum ($d_P=2^P-1/d_P=0$), $d_M$ is increased/decreased by 1: the lower/upper connected tap is opened and the following/previous tap is closed.

As noted before, an object of the present disclosure is to extend the inherent monotonicity of the main sub-DAC (in this case, the resistor string) to the resulting segmented DAC. According to the sequence of operation previously described, a monotonic transfer function $V_{DAC}$ is generated irrespective the mismatch of the current sources I, the current subdivisions $\Delta I_L$ and/or the resistors R of the string (assuming that these mismatches are independent enough of the signal levels or, equivalently, of $d_{IN}$). The inherent monotonicity is provided by the following observations:

Any increase of $d_L$ means diverting a multiple of $\Delta I_L>0$ to a terminal located upwards in the resistor string; hence, the new $V_{DAC}$ cannot be smaller than the previous $V_{DAC}$ due to the resistor string structure (assuming $R\geq 0$) and the thermometric logic of the current divider. Similarly, any decrease of $d_L$ means diverting a multiple of $\Delta I_L>0$ to a terminal located downwards in the resistor string 53. Hence, the new $V_{DAC}$ cannot be bigger than the previous $V_{DAC}$ due to the resistor string structure (assuming $R\geq 0$) and the thermometric logic of the current divider.

Any increase of $d_P$ means diverting a multiple of $I>0$ to a terminal located upwards in the resistor string; hence, the new $V_{DAC}$ cannot be smaller than the previous $V_{DAC}$ due to the resistor string structure (assuming $R\geq 0$) and the thermometric logic of the current source array. Any decrease of $d_P$ means diverting a multiple of $I>0$ to a terminal located downwards in the resistor string; hence, the new $V_{DAC}$ cannot be bigger than the previous $V_{DAC}$ due to the resistor string structure (assuming $R\geq 0$) and the thermometric logic of the current source array.

Any increase of $d_M$ means diverting a positive current to a terminal located upwards in the resistor string; hence, the new $V_{DAC}$ cannot be smaller than the previous $V_{DAC}$ due to the resistor string structure (assuming $R\geq 0$). Any decrease of $d_M$ means diverting a positive current to a terminal located downwards in the resistor string; hence, the new $V_{DAC}$ cannot be bigger than the previous $V_{DAC}$ due to the resistor string structure (assuming $R\geq 0$).

Any current source being subdivided by the current divider 72 is eventually injected directly into the corresponding terminal of the resistor string 53 following an increase of $d_{IN}$. Hence, the new $V_{DAC}$ in an increasing transition between the second and the third segmentation levels cannot be smaller than the previous $V_{DAC}$ due to the selected method of controlling the DAC segments. Similarly, any current source being subdivided by the current divider is eventually injected directly into the corresponding terminal of the resistor string following a decrease of $d_{IN}$. As a consequence the new $V_{DAC}$ in a decreasing transition between the second and the third segmentation levels cannot be bigger than the previous $V_{DAC}$ due to the selected logic.

Therefore, the described DAC core architecture is monotonic irrespective the mismatch of the components if said mismatch is independent of $d_{IN}$. In practice, this involves generating the current sources I and the current subdivisions $\Delta I_L$ in such a way that they are sufficiently insensitive to the signal level in the resistor string, which, in general, varies significantly with $d_{IN}$. Consequently, the output impedance of the cells generating I and $\Delta I_L$ should be high enough to be insensitive to their, potentially variable, output voltage.

The matching of the current sources 62 is $2^L$ times more critical than the matching of the current subdivisions $\Delta I_L$ due to their relative weighting in the transfer function. Assuming that the current sources 62 present an output impedance $r_I$, then (if $r_I >> 2^{M+P} \cdot R$) the induced Integral Non Linearity, $INL_{r_I}$ at $V_{DAC}$ can be estimated as (where the decimal equivalent of the digital words is applied):

$$INL_{r_I}(d_M, d_P) = \frac{I \cdot [(d_M + 1) \cdot R]^2 \cdot d_P \cdot (2^P - d_P)}{r_I} \quad (19)$$

From equation 19, the maximum $INL_{r_I}$ induced by a finite $r_I$ takes place for $d_M=2^M-1$ and $d_P=2^{P-1}$; it is given, particularizing (19), by:

$$INL_{r_I}^{MAX} = INL_{r_I}(d_M = 2^M - 1, d_P = 2^{P-1}) = \frac{2^{2 \cdot M + 2 \cdot P - 2} \cdot I \cdot R^2}{r_I} \quad (20)$$

Another object of the present disclosure is to prevent the segmentation technique from deteriorating the dynamics of the resulting segmented DAC respect to the intrinsic dynamics of the main sub-DAC.

In the DAC core architecture shown in FIG. 6, the resistor string implements the main sub-DAC; therefore, the switching associated to the extra levels of segmentation (in this case, the switching of the current sources 62 outputting a current I and the current subdivisions $\Delta I_L$) should not perturb the nodes of the resistor string. This can be accomplished by arranging that the devices generating I and $\Delta I_L$ are always carrying their nominal signal level by, for instance, the use of overlapping control signals for the corresponding switches.

The current $I_{GND}$ flowing through the parasitic impedance Rp (see FIG. 6) of the track to the ground potential $V_{GND}$ is independent of $d_{IN}$. Therefore, it does not produce linearity error which is a desirable feature. It may however introduce a small offset error. Furthermore, the current $I_{DD}$ taken from the supply rail (represented by $V_{DD}$ in FIG. 6) is also independent of $d_{IN}$, which is a desirable feature. In particular:

$$I_{DD}=I_{GND}=2^P \cdot I \neq f(d_{IN}) \quad (21)$$

Example of Decoding Logic

To support the previously described operation, a decoding circuit provided in the controller 20 generates the control signals for the switches 54, 64 and 78 in the segments which form the sub-DACs. DAC1, DAC2 and DAC3 of the DAC core from the digital input word $d_{IN}$.

The switches 54, which will also be represented as SM<$2^M$:0> and associated to the taps of the resistor string are controlled by the most significant sub-word $d_M=d_{IN}[N-1:P+L]$. For any given $d_{IN}$, only two consecutive switches SM (SM<$d_M$> and SM<$d_M$+1>) are on (the other $2^M-1$ switches 54 being turned off). The value of $d_M$ can be calculated form $d_{IN}$ as (where the decimal equivalent of the digital word is applied and the function int(x) represents the integer part of x):

$$d_M = \text{int}\left(\frac{d_{IN}}{2^{P+L}}\right) \quad (22)$$

The logic associated with the most significant sub-DAC is summarized in the following table (where the state of the switches SM is indicated for each $d_M$):

TABLE 1

Most significant sub-DAC truth table.

| $d_M = d_{IN}[N-1:P+L]$ | | | | | SM $<2^M:0>$ | | | | | |
|---|---|---|---|---|---|---|---|---|---|---|
| N−1 | N−2 | ... | P+L+1 | P+L | $2^M$ | $2^M-1$ | ... | 2 | 1 | 0 |
| 0 | 0 | ... | 0 | 0 | OFF | OFF | ... | OFF | ON | ON |
| 0 | 0 | ... | 0 | 1 | OFF | OFF | ... | ON | ON | OFF |
| 0 | 0 | ... | 1 | 0 | OFF | OFF | ... | ON | OFF | OFF |
| . | . | ... | . | . | . | . | ... | . | . | . |
| 1 | 1 | ... | 0 | 1 | OFF | OFF | ... | OFF | OFF | OFF |
| 1 | 1 | ... | 1 | 0 | OFF | ON | ... | OFF | OFF | OFF |
| 1 | 1 | ... | 1 | 1 | ON | ON | ... | OFF | OFF | OFF |

The switches 64, also designated as SP$<2^P-1:0>$, associated with respective ones of the current sources in the current source array within the second segment DAC2 are controlled by the partially significant sub-word $d_P = d_{IN}[P+L-1:L]$. These switches always divert each current source I to (only) one of the following nodes, the second shared switch node 112 (hence, forming part of $I_{P1}$), the first shared switch node 110 (hence, forming part of $I_{P2}$), or the input terminal 120 of the current divider 72 of the third segment DAC3 to be further subdivided. For any given $d_{IN}$, one current source is diverted to the current divider, while the number $j_1$ of current sources diverted to node 112 and the number $j_2$ of current sources diverted to node 110 depends on the parity of $d_M$ calculated from (22); in any case, from (5), $j_1+j_2=2^P-1$. If $d_M$ is even, $j_1$ and $j_2$ are given by (where the decimal equivalent of the digital word is applied):

$$j_1 = d_P; j_2 = 2^P - 1 - d_P \quad (23)$$

If $d_M$ is odd, $j_1$ and $j_2$ are given by (where the decimal equivalent of the digital word is applied):

$$j_1 = 2^P - 1 - d_P; j_2 = d_P \quad (24)$$

For any given $d_{IN}$, $d_P$ can be calculated as (where the decimal equivalent of the digital words is applied and $d_M$ is calculated form (22)):

$$d_P = \text{int}\left(\frac{d_{IN} - 2^{P+L} \cdot d_M}{2^L}\right) \quad (25)$$

There is some degree of flexibility for selecting the specific sequence by which the different current sources 62 are diverted to each node as a function of $d_{IN}$. This fact can be used to efficiently implement some calibration techniques. As described previously, in order to guarantee the monotonicity, the current being subdivided by the current divider is the next one to be diverted to the resistor string.

The logic associated with the partially significant sub-DAC is summarized in the Table 2 for even $d_M$, and in Table 3 for odd $d_M$. As $d_{IN}$ varies and, thus, the parity of $d_M$ changes, the applicable logic for the partially significant sub-DAC also changes (every multiple of $2^M$) to reflect the role exchange between $I_{P1}$ and $I_{P2}$. In Table 2 and 3, a sorted sequence for the switching of current sources is assumed for simplicity (but which, in practice, is unnecessary due to the intrinsic flexibility) and the enabled path of the 3-way switches is indicated by the node where the corresponding current source is diverted.

The preferred logic follows a cyclical pattern. This involves that, when the parity of $d_M$ changes as a result of 1·LSB transition (or, in general, a transition of $<2^L$·LSB) corresponding to an update on the SM switches, the control logic of the SP switches remains unchanged for said transition, thus potentially improving the dynamics of the transition associated to the main sub-DAC (which are the most demanding ones).

TABLE 2

Partially significant sub-DAC truth table for even $d_M$ (3 levels of segmentation).

| $d_P = d_{IN}[P+L-1:L]$ | | | | | SP $<2^P-1:0>$ | | | | | |
|---|---|---|---|---|---|---|---|---|---|---|
| P+L−1 | P+L−2 | ... | L+1 | L | $2^P-1$ | $2^P-2$ | ... | 2 | 1 | 0 |
| 0 | 0 | ... | 0 | 0 | $V_{R2}$ | $V_{R2}$ | ... | $V_{R2}$ | $V_{R2}$ | $V_I$ |
| 0 | 0 | ... | 0 | 1 | $V_{R2}$ | $V_{R2}$ | ... | $V_{R2}$ | $V_I$ | $V_{R1}$ |
| 0 | 0 | ... | 1 | 0 | $V_{R2}$ | $V_{R2}$ | ... | $V_I$ | $V_{R1}$ | $V_{R1}$ |
| . | . | ... | . | . | . | . | ... | . | . | . |
| 1 | 1 | ... | 0 | 1 | $V_{R2}$ | $V_{R2}$ | ... | $V_{R1}$ | $V_{R1}$ | $V_{R1}$ |
| 1 | 1 | ... | 1 | 0 | $V_{R2}$ | $V_I$ | ... | $V_{R1}$ | $V_{R1}$ | $V_{R1}$ |
| 1 | 1 | ... | 1 | 1 | $V_I$ | $V_{R1}$ | ... | $V_{R1}$ | $V_{R1}$ | $V_{R1}$ |

TABLE 3

Partially significant sub-DAC truth table for odd $d_M$ (3 levels of segmentation).

| $d_P = d_{IN}[P+L-1:L]$ | | | | | SP $<2^P-1:0>$ | | | | | |
|---|---|---|---|---|---|---|---|---|---|---|
| P+L−1 | P+L−2 | ... | L+1 | L | $2^P-1$ | $2^P-2$ | ... | 2 | 1 | 0 |
| 0 | 0 | ... | 0 | 0 | $V_I$ | $V_{R1}$ | ... | $V_{R1}$ | $V_{R1}$ | $V_{R1}$ |
| 0 | 0 | ... | 0 | 1 | $V_{R2}$ | $V_I$ | ... | $V_{R1}$ | $V_{R1}$ | $V_{R1}$ |
| 0 | 0 | ... | 1 | 0 | $V_{R2}$ | $V_{R2}$ | ... | $V_I$ | $V_{R1}$ | $V_{R1}$ |
| . | . | ... | . | . | . | . | ... | . | . | . |
| 1 | 1 | ... | 0 | 1 | $V_{R2}$ | $V_{R2}$ | ... | $V_I$ | $V_{R1}$ | $V_{R1}$ |
| 1 | 1 | ... | 1 | 0 | $V_{R2}$ | $V_{R2}$ | ... | $V_{R2}$ | $V_I$ | $V_{R1}$ |
| 1 | 1 | ... | 1 | 1 | $V_{R2}$ | $V_{R2}$ | ... | $V_{R2}$ | $V_{R2}$ | $V_I$ |

The switches SL$<2^L-1:0>$ associated with the current divider of the third segment are controlled by the least significant sub-word $d_L = d_{IN}[L-1:0]$. These switches always divert each current division $\Delta I_L$ to (only) one of the following nodes: the first shared switching node 110 (hence, forming part of $I_{L2}$) or the second shared switching node 112 (hence, forming part of $I_{L1}$). For any given $d_{IN}$, the number $k_1$ of current divisions diverted to node 112 and the number $k_2$ of current divisions diverted to node 110 depends on the parity of $d_M$ calculated from (22); in any case, from (6), $k_1+k_2=2^L$.

If $d_M$ is even, $k_1$ and $k_2$ are given by:

$$k_1 = d_L; k_2 = 2^L - d_L \quad (26)$$

If $d_M$ is odd, $k_1$ and $k_2$ are given by:

$$k_1 = 2^L - d_L; k_2 = d_L \quad (27)$$

For any given $d_{IN}$, $d_L$ can be calculated as (where the decimal equivalent of the digital words is applied, $d_M$ is calculated form (22) and $d_P$, from (25)):

$$d_L = d_{IN} - 2^{P+L} \cdot d_M - 2^L \cdot d_P \quad (28)$$

The logic associated to the least significant sub-DAC is set out in the Table 4 (for even $d_M$) and in Table 5 (for odd $d_M$).

TABLE 4

Least significant sub-DAC truth table for even $d_M$ (3 levels of segmentation).

| $d_L = d_{IN}[L-1:0]$ | | | | | $SL < 2^L - 1:0 >$ | | | | | |
|---|---|---|---|---|---|---|---|---|---|---|
| L-1 | L-2 | ... | 1 | 0 | $2^L-1$ | $2^L-2$ | ... | 2 | 1 | 0 |
| 0 | 0 | ... | 0 | 0 | $V_{R2}$ | $V_{R2}$ | ... | $V_{R2}$ | $V_{R2}$ | $V_{R2}$ |
| 0 | 0 | ... | 0 | 1 | $V_{R2}$ | $V_{R2}$ | ... | $V_{R2}$ | $V_{R2}$ | $V_{R1}$ |
| 0 | 0 | ... | 1 | 0 | $V_{R2}$ | $V_{R2}$ | ... | $V_{R2}$ | $V_{R1}$ | $V_{R1}$ |
| . | . | ... | . | . | . | . | ... | . | . | . |
| 1 | 1 | ... | 0 | 1 | $V_{R2}$ | $V_{R2}$ | ... | $V_{R1}$ | $V_{R1}$ | $V_{R1}$ |
| 1 | 1 | ... | 1 | 0 | $V_{R2}$ | $V_{R2}$ | ... | $V_{R1}$ | $V_{R1}$ | $V_{R1}$ |
| 1 | 1 | ... | 1 | 1 | $V_{R2}$ | $V_{R1}$ | ... | $V_{R1}$ | $V_{R1}$ | $V_{R1}$ |

TABLE 5

Least significant sub-DAC truth table for odd $d_M$ (3 levels of segmentation).

| $d_L = d_{IN}[L-1:0]$ | | | | | $SL < 2^L - 1:0 >$ | | | | | |
|---|---|---|---|---|---|---|---|---|---|---|
| L-1 | L-2 | ... | 1 | 0 | $2^L-1$ | $2^L-2$ | ... | 2 | 1 | 0 |
| 0 | 0 | ... | 0 | 0 | $V_{R1}$ | $V_{R1}$ | ... | $V_{R1}$ | $V_{R1}$ | $V_{R1}$ |
| 0 | 0 | ... | 0 | 1 | $V_{R1}$ | $V_{R1}$ | ... | $V_{R1}$ | $V_{R1}$ | $V_{R2}$ |
| 0 | 0 | ... | 1 | 0 | $V_{R1}$ | $V_{R1}$ | ... | $V_{R1}$ | $V_{R2}$ | $V_{R2}$ |
| . | . | ... | . | . | . | . | ... | . | . | . |
| 1 | 1 | ... | 0 | 1 | $V_{R1}$ | $V_{R1}$ | ... | $V_{R2}$ | $V_{R2}$ | $V_{R2}$ |
| 1 | 1 | ... | 1 | 0 | $V_{R1}$ | $V_{R1}$ | ... | $V_{R2}$ | $V_{R2}$ | $V_{R2}$ |
| 1 | 1 | ... | 1 | 1 | $V_{R1}$ | $V_{R2}$ | ... | $V_{R2}$ | $V_{R2}$ | $V_{R2}$ |

As $d_{IN}$ varies and, thus, the parity of $d_M$ changes, the applicable logic for the least significant sub-DAC also changes (every multiple of $2^M$) to reflect the role exchange between $I_{L1}$ and $I_{L2}$, following the operation previously described. In Tables 4 and 5, a sorted sequence for the switching of current divisions is assumed for simplicity (which, in practice, is unnecessary due to the intrinsic flexibility) and the enabled path of the 2-way switches is indicated by the node where the corresponding current division is diverted.

Circuit Enhancements

Several circuit implementations based on digital cells of the described logic are possible, with the corresponding space for optimization. On the other hand, an overlapping control of the switches can be used to improve the dynamics by minimizing the potential glitches caused by the switching (not described here).

Figure 7:
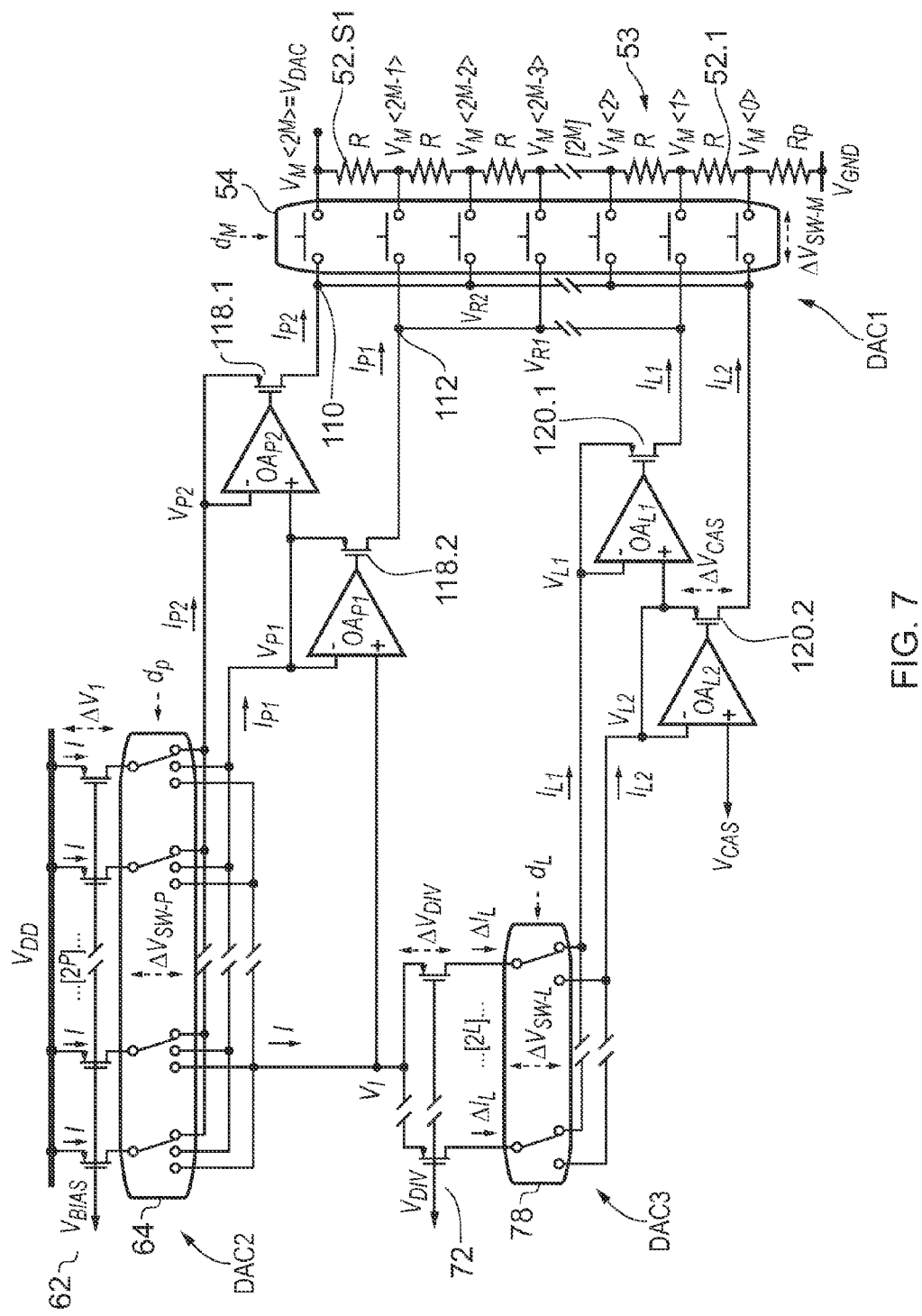
FIG. 7 shows the arrangement of FIG. 6 with active cascode circuits, where cascode transistors are placed within the feedback loop of an operational amplifier.

In a preferred embodiment, both the current sources 62 and the current subdivisions $\Delta I_L$ are implemented by a Metal-Oxide-Semiconductor Field effect transistor (MOSFET) devices conveniently biased and matched, as it is represented in FIG. 7. It should be noted that the term MOSFET remains in use to describe a topology where the metal layer of the gate is replaced by a conductive non-metallic layer.

To increase the output impedance of these basic cells, a cascoding technique may be employed, which involves inserting a cascoding transistors in the drain path of the corresponding MOS transistors to force the drain voltage to a convenient biasing value. Since both the current sources and the current divider injects current to the resistor string, two levels of cascoding are desirable as shown in FIG. 7.

An important function of the cascoding, in addition to providing isolation from the variable signal level in the resistor string 53, is to force a similar enough voltage at the drain of the MOS transistors implementing the current sources and dividers irrespective the path where the corresponding current is diverted to. This mitigates mismatch induced by channel length modulation which might otherwise produce an undesired current variation depending on the state of the switch because the drain voltage would be, in general, different. Nevertheless, this potential effect is limited since all the current sources and dividers are connected to two consecutives taps of the resistor string; consequently, the voltage difference is limited to a maximum of $2^{P+L} \cdot V_{LSB}$.

From (20), the required magnitude of the output impedance of the current sources for a given tolerable INL at $V_{DAC}$ can be estimated. Assuming a target of $1 \cdot V_{LSB}$ and applying the condition $INL_{r_I}^{MAX} < V_{LSB}$ to (20), the minimum required output impedance $r_I^{MIN}$ for the current source cells is established as:

$$r_I > r_I^{MIN} = 2^{2 \cdot M + 2 \cdot P + L - 2} \cdot R \qquad (29)$$

In order to obtain the desired output impedance, an option is to cascode each relevant MOS by a dedicated cascoding device conveniently biased and inserted between the MOS to be isolated and the corresponding switch. This is feasible because the nominal current is always flowing through all the cells and, hence, a cascoding MOS connected in series can be kept in saturation for any $d_{IN}$, thus providing a proper cascoding. The number of extra devices to implement the cascoding following this approach would be $2^P + 2^L$.

To save components, the transistors forming the switches 64 and 78 can be reused as cascodes when they are turned on by driving the switch gate to the biasing voltage of the cascode instead of to a digital signal. Since, for all the multiple-way switch, one of the branches is enabled for any given $d_{IN}$, a proper cascoding is always performed.

Another option to save components is cascoding after the switches, once their outputs are joined to form $I_{P1}$, $I_{P2}$, $I_{L1}$ and $I_{L2}$. This approach is shown in FIG. 7, where MOS devices 118.1, 118.2, 120.1, 120.2 are included to cascode the branches associated to $I_{L1}$ and $I_{L2}$ at the level of the current divider, and $I_{P1}$ and $I_{P2}$ at the level of the current source array (an explicit cascode for the input current of the current divider is not necessary because the MOS devices implementing the current divider are indirectly doing such a function, especially assuming the normal operation where the nominal current across these MOS transistors is nominally constant). Hence, the number of cascoding MOS devices is reduced to four, although their size needs to be increased to accommodate the increased current level (although not necessarily in the same proportion as the reduction in the number of devices, thus offering a potential area saving).

In the branches whose current varies ($I_{P1}$, $I_{P2}$, $I_{L1}$ and $I_{L2}$), a regulated cascode may be used to prevent the cascoded voltage from varying with these input dependent currents (which would deteriorate the matching of both the current sources I and the current subdivisions $\Delta I_P$). The regulated cascodes can be implemented by an Operational Amplifier (OA) in negative feedback configuration driving the gate of the cascoding MOSFETs 118.1, 118.2, 120.1, 120.2 (other implementations are possible).

The operational amplifiers used in the regulated cascodes ($OA_{P1}$, $OA_{P2}$, $OA_{L1}$, $OA_{L2}$ in FIG. 7) can be implemented very efficiently in terms of area and power because both their static and dynamic performance is relatively undemanding. In particular, $V_{DAC}$ is significantly insensitive to the input referred error (including offset, nonlinearity, drift, noise...) associated with these amplifiers because the potential error would be transmitted to $V_{DAC}$ by the channel length modulation of the cascoded transistors, whose influence is negligible as long as they remain in saturation. This significantly simplifies the design of these operational amplifiers. The use of regulated cascodes, necessary for the variable current, also enhances the cascoding in the presence of any other perturbation due to the negative feedback and the gain of the amplifier and, hence, the obtained accuracy would be, in general, better than that associated to simple cascodes. Notably, it enables to achieve the required minimum output impedance for the current sources established in (29).

Effectively, the equivalent output impedance of the current sources in increased by a factor (approximately) equal to the open-loop gain of the operational amplifiers with respect to the value for an unregulated cascode.

The bias voltage $V_{CAS}$ used to cascode the current divider (see FIG. 7) is selected to provide the desired value for the operation of the current divider (clearly, $V_{CAS} > V_{DAC}$ with enough margin is a necessary condition to ensure a proper current division). One of the operational amplifiers associated to the cascoding of the current divider can sense the inverting input of the other amplifiers instead of $V_{CAS}$ to track the error of the former operational amplifier, thus improving the similarity of the voltage forced at the drain of the protected cells by the operational amplifiers (only the error associated with one OA is applied, instead of the difference in the error of both, which in general is worse due to the random offset) and, consequently, enhancing the matching of the current subdivisions $\Delta I_L$ (in FIG. 7, for instance, $OA_{L1}$ senses the inverting input $V_{L2}$ of $OA_{L2}$, instead of $V_{CAS}$).

The voltage $V_{DIV}$ used for biasing the current divider MOSFETs 73 in the current divider 72 is designed to provide the desired value in $V_I$ for the operation of the current sources (in this case, $V_{DIV} > V_{CAS}$ with enough margin to keep the current divider MOS transistors well in saturation but without compressing too much the headroom available for the current sources I).

The resulting voltage at $V_I$ is sensed by the operational amplifiers associated with the regulated cascodes of the current sources array ($OA_{P1}$, $OA_{P2}$) and it is used to force their respective cascoded nodes to $V_I$, improving the current source matching. Again, one of the operational amplifiers associated with the cascoding of the current source array can sense the inverting input of the other OA instead of $V_I$, analogously to the current divider (as in FIG. 7); however, in this case, the benefit is not clear since $V_I$ is also applied to the terminal of one of the current sources.

A biasing circuit (not shown in FIG. 7) generates the voltages $V_{CAS}$, $V_{DIV}$ and $V_{BIAS}$ from the analog reference voltage $V_{REF}$ of the DAC. The biasing voltage $V_{BIAS}$ is used to generate the matched current sources I; from (1) and (18), a condition for the definition of $V_{LSB}$ can be established (which is relevant for designing the size of I·R from a given $V_{REF}$):

$$V_{LSB} = \frac{V_{REF}}{2^N} = \frac{I \cdot R}{2^L} \rightarrow I \cdot R = \frac{V_{REF}}{2^{N-L}} = \frac{V_{REF}}{2^{M+P}} \quad (30)$$

In practice, $V_{BIAS}$ is generated from a current obtained by forcing $V_{REF}$ in the terminals of a reference resistor $R_R$. Therefore, the current I from the current sources 62 tracks the thermal drift of $R_R$ and, if $R_R$ is implemented by the same material as the resistors R of the resistor string 53, the thermal drift in $V_{DAC}$ is substantially cancelled because the ratio $R/R_R$ is substantially preserved. Any offset or gain error associated to the generation of I from $V_{REF}$ would translate into a gain error in $V_{DAC}$, while the corresponding drift would produce gain drift in $V_{DAC}$.

The embodiment presented in FIG. 7 requires a minimum amount of voltage headroom to support the operation of the current sources I, the current divider and the corresponding cascodes. Measuring the headroom $V_H$ from $V_{DD}$ to $V_{DAC}$, it is formed by the following components:

1) The source-drain voltage $\Delta V_I$ of the current source PMOS.
2) The source-drain voltage $\Delta V_{DIV}$ of the current divider PMOS.
3) The voltage drop associated to the current sources switches ($\Delta V_{SW-P}$), the current divider switches ($\Delta V_{SW-L}$) and the resistor string switches ($\Delta V_{SW-M}$).
4) The source-drain voltage drop $\Delta V_{CAS}$ of the regulated cascode PMOS associated to the current divider (the rest of cascodes are in parallel to the listed components, thus not contributing to the headroom).

The total $V_H$ is, for this embodiment of the present disclosure:

$$V_H = \Delta V_I + \Delta V_{SW-P} + \Delta V_{DIV} + \Delta V_{SW-L} + \Delta V_{CAS} + \Delta V_{SW-M} \quad (31)$$

To save headroom without, potentially, loss of accuracy, the merging of the cascodes with the switches may be done using the regulated approach. In this case, the headroom term $\Delta V_{SW-L} + \Delta V_{CAS}$ associated with the switching and the cascoding of the last current divider can be reduced to $\Delta V_{CAS}$, which is a relatively minor benefit (other headroom savings would not be possible because the cascoding of other structures are in parallel to the limiting current path). In general, a dedicated amplifier is required for each switch, which is not attractive. In practice, as the same current in nominally flowing through all switches, the regulating amplifiers have to compensate only for the voltage variation at the output of the cell; therefore, an amplifier per possible path (in this case, 2) may suffice (especially, due to the scaled accuracy requirement of the current divider).

Other approach to reduce the headroom consumed is the modification of the core architecture in such a way that the currents $I_{P1}$, $I_{P2}$, $I_{L1}$ and $I_{L2}$ are generated in parallel to the resistor string, instead of in series. Several implementations of the concept are possible; in any case, mirroring the signal currents to be injected in the resistor string is eventually necessary, with the corresponding cost in extra power and settling time (the power increase may be compensated, at least, partially, by a reduced supply range which is the motivation for this architectural modification).

Figure 8:
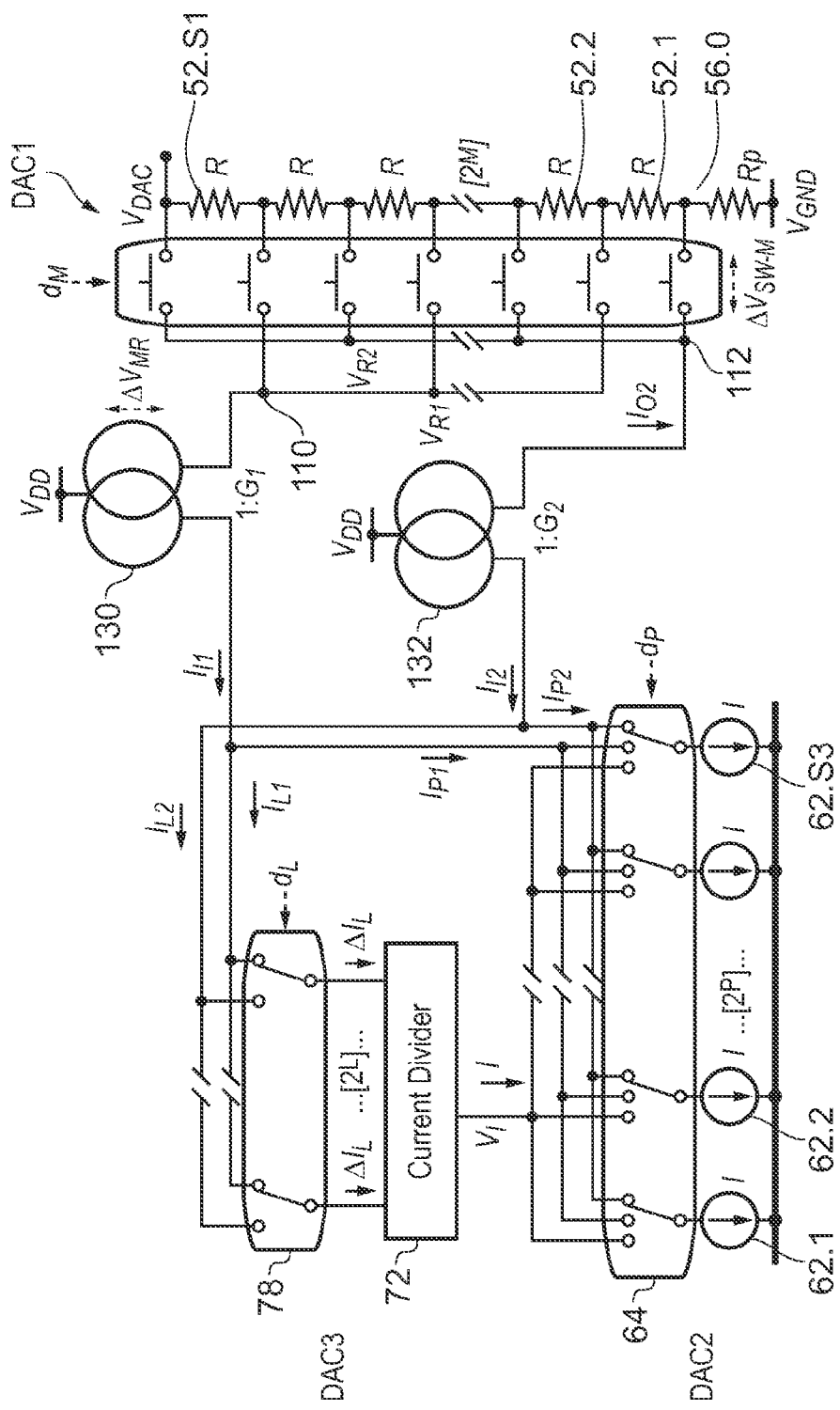
FIG. 8 shows a further modification where currents for the DAC segments are produced in parallel.

A generic embodiment of this approach is illustrated in FIG. 8. If the headroom required for the operation of the current mirrors $\Delta V_{MR}$ is less than the headroom associated with the current sources, the current divider and the corresponding cascoding and switches in series, then a reduced headroom consumption in the DAC core is possible. In practice, at least, the headroom corresponding to the current divider ($\Delta V_{DIV} + \Delta V_{SW-L}$) can be relatively easily saved.

Figure 9:
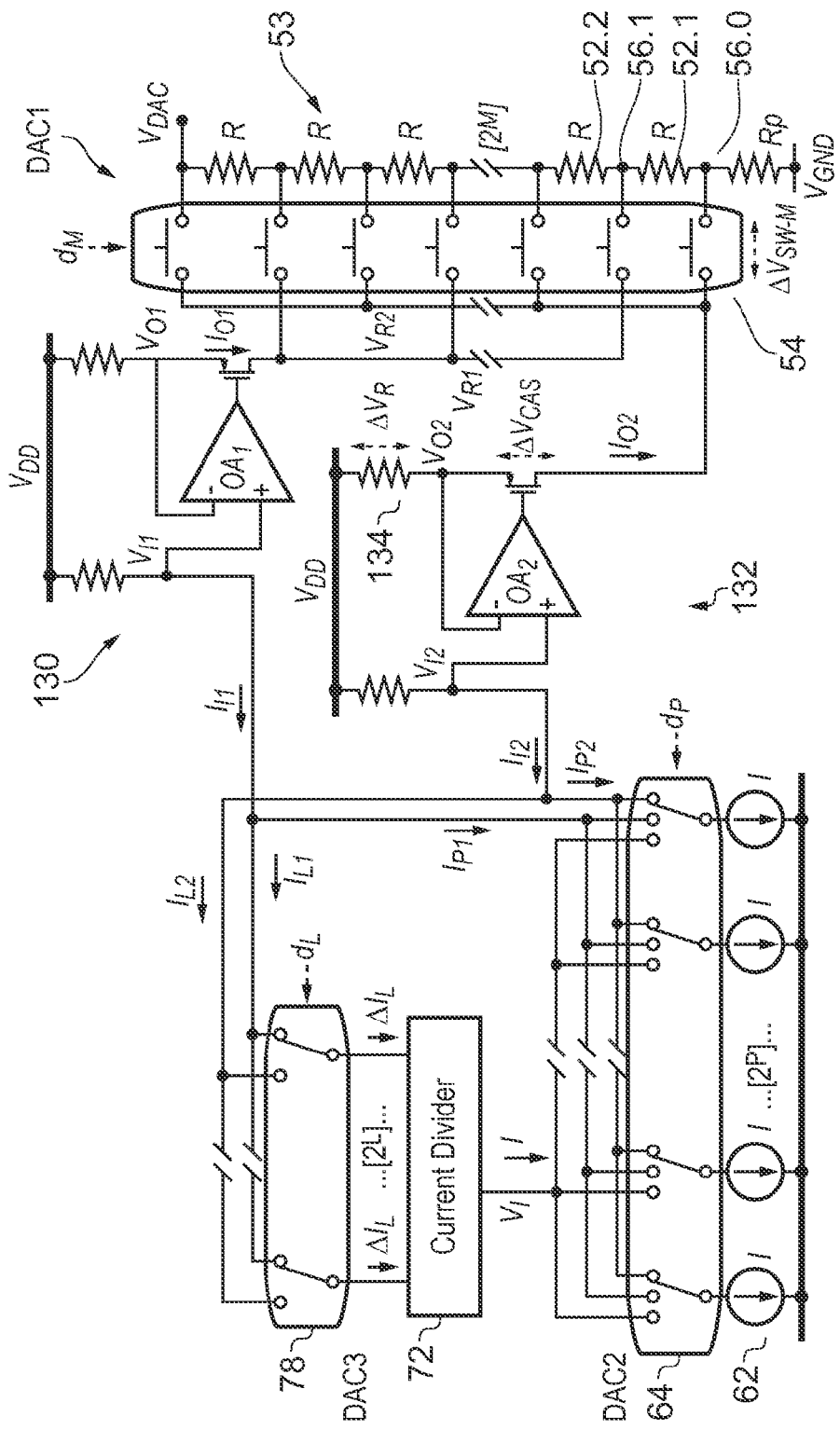
FIG. 9 shows an embodiment of FIG. 8 in greater detail.

At least two different current mirrors 130, 132 are provided to inject independent currents into nodes 110 and 112 Therefore, the mismatch in the mirroring ($G_1 \neq G_2$) would be a source of nonlinearity and, in particular, the monotonicity is no longer guaranteed (a maximum tolerable gain error in the mirroring would apply to obtain a monotonic transfer function). Therefore, in general, following this approach involves trading headroom for accuracy. In practice, a low headroom solution of the present disclosure can be obtained with reasonable accuracy if highly linear current mirrors are used. In FIG. 9, a practical embodiment of the low headroom version of the present disclosure is illustrated. Regulated cascoded current mirrors are used to mirror $I_{I1} = I_{P1} + I_{L1}$ and $I_{I2} = I_{P2} + I_{L2}$, thus injecting $I_{O1}$ and $I_{O2}$, respectively, in the resistor string. This mirroring technique offers high accuracy at a reasonable cost; in practice, other techniques known in the state of the art may be successfully applied. The Operational Amplifiers ($OA_1$, $PA_2$) used in the output impedance boosting of the current mirrors have relatively undemanding static and dynamic requirements; hence, a moderate power and area implementation is possible. In particular, the offset of $OA_1$ and $OA_2$ is always applied in the transfer function but with a weighting which depends of $d_M$; hence, it translates into a gain error in the transfer function along with a nonlinearity component at the P+L bits level. The resulting headroom $V_H$ in the embodiment of FIG. 9 is reduced to the following contributions: the voltage drop $\Delta V_R$ of the mirroring resistor 134 in the output branch of the current mirror, the source-drain voltage drop $\Delta V_{CAS}$ of the regulated cascode PMOS in the same branch and the voltage drop associated to the resistor string switches ($\Delta V_{SW-M}$). Therefore, in the case of the low headroom embodiment, the total required headroom $\overline{V_H}$ is:

$$\overline{V_H} = \Delta V_R + \Delta V_{CAS} + \Delta V_{SW-M} \quad (32)$$

The headroom requirement established by (32) is more attractive than the one associated to the previously described embodiment of the present disclosure (see (31)).

In the low headroom embodiment, the polarity of the current sources 62 in the current source array and the current divider have been inverted respect to the previous embodiment (FIG. 7). These blocks can be also cascoded to increase the accuracy but, in this case, without such tight restrictions on headroom. As a result, multiple levels of simple cascoding may be considered.

Another approach to reduce the headroom requirement of the first embodiment is sourcing $I_{L1}$ and $I_{L2}$ to a pair of current mirrors to convey them from the upper rail to be injected in the resistor string. In such a case, the error in the mirroring and conveying of $I_{L1}$ and $I_{L2}$ would be a source of nonlinearity. Furthermore, the potential headroom saving is less than the one associated to the low headroom embodiment previously presented.

According to the preferred logic for driving the segments and as described previously, the currents $I_{P1}$, $I_{P2}$, $I_{L1}$ and $I_{L2}$ can present a zero magnitude depending on $d_{IN}$. In particular, for $d_L=0$, $I_{L1}=0$ if $d_M$ is even and $I_{L2}=0$ if $d_M$ is odd (see Table 4 and 5). Concerning $I_{P1}$ and $I_{P2}$, $I_{P1}=0$ for $d_L=0$ if $d_M$ is even and for $d_L=2^P-1$ if $d_M$ is odd; analogously, $I_{P2}=0$ for $d_L=0$ if $d_M$ is odd and for $d_L=2^P-1$ if $d_M$ is even (see Table 2 and 3). A minimum signal level in $I_{P1}$, $I_{P2}$, $I_{L1}$ and $I_{L2}$ is convenient to keep the associated cascodes in their regulation region, thus improving the accuracy and the dynamics.

The decoding and driving logic can be modified to generate the desired transfer function while having always positive values for the currents $I_{P1}$, $I_{P2}$, $I_{L1}$ and $I_{L2}$. However, the monotonicity of the device may no longer be guaranteed. To solve this issue, some dummy currents $I_{P-D}$ and $I_{L-D}$ can be introduced to force a minimum current through the regulated cascodes when required. Furthermore, it is possible to divert these dummy currents to the bottom of the resistor string when not required (thus, keeping the power consumption independent of $d_{IN}$ and preventing any potential linearity error induced by diverting $I_{P-D}$ and $I_{L-D}$ as a function of $d_{IN}$). The resulting embodiment is shown in FIG. 10, which allows using the preferred logic while providing always a minimum current level for the regulation of the cascodes.

Only one dummy current $I_{P-D}$ generated by current source 140.1 is necessary for the regulated cascodes associated with $I_{P1}$ and $I_{P2}$ because these both currents cannot be zero simultaneously (according to the presented logic). Similarly, only 1 dummy current $I_{L-D}$ is necessary for the regulated cascodes associated to $I_{L1}$ and $I_{L2}$. These dummy currents $I_{P-D}$ and $I_{L-D}$ can be conveniently generated from $V_{BIAS}$ by further transistors 140.1 and 140.2, considering the desired weighting factor (other implementations are possible). The specific value of the dummy current is not important provided that it is reasonably big to allow the regulation of the cascode and small enough to minimize the penalty in terms of power dissipation.

Figure 10:
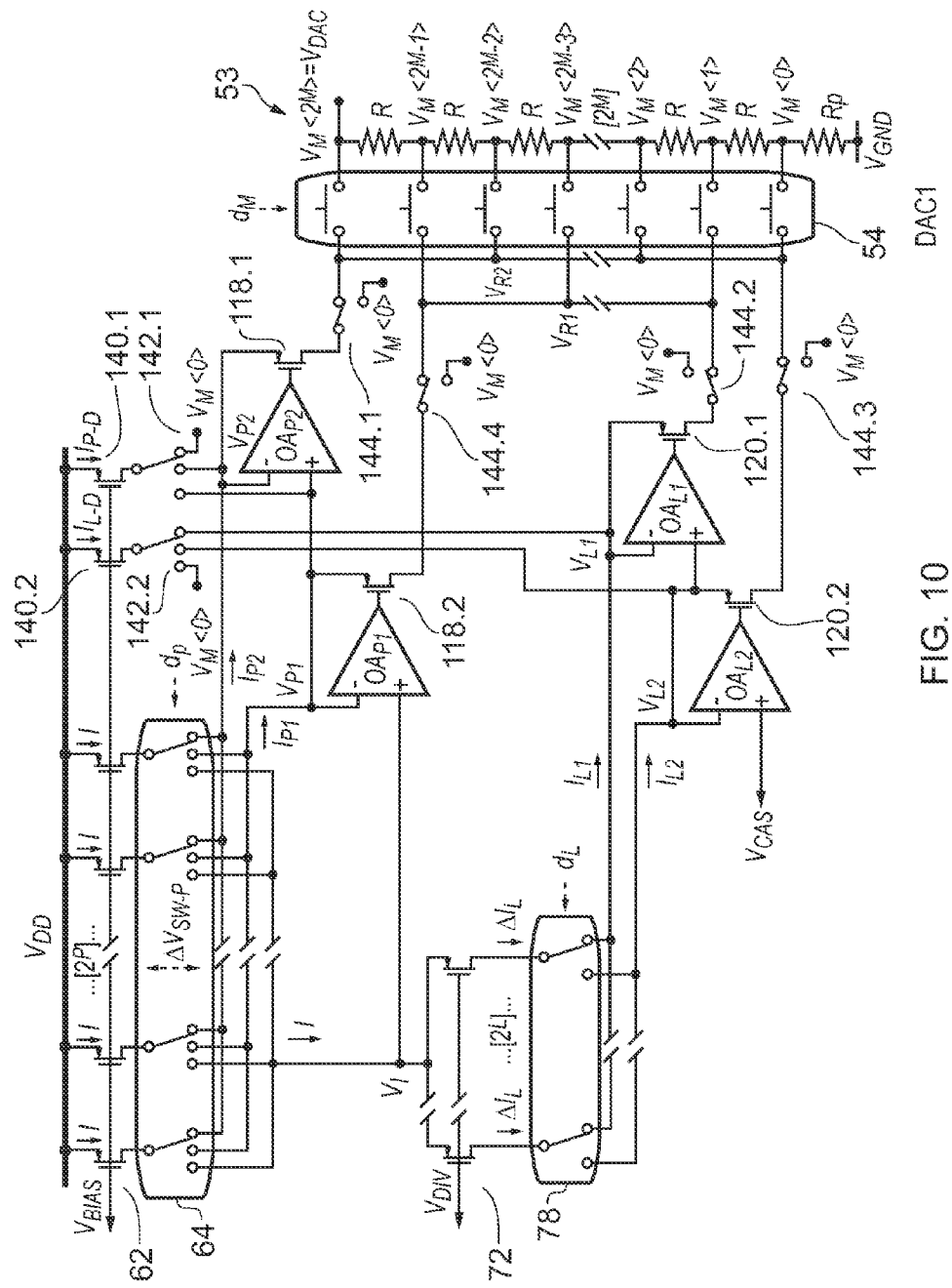
FIG. 10 shows an arrangement including circuits to inject dummy currents to force a minimum current through the cascode transistors.

As illustrated in FIG. 10, 3-way switches 142.1 and 142.2 are used to divert the dummy currents to the corresponding cascode device or to the bottom of the resistor string (tap $V_M<0>$) when they are not necessary. The absolute value of $I_{P-D}$ and $I_{L-D}$ is not relevant but a similar magnitude irrespective of the value of $d_{IN}$ is desirable in order to minimize a potential nonlinearity. This provides a similar voltage at the drain of the MOS devices 140.1 and 140.2 implementing $I_{P-D}$ and $I_{L-D}$, irrespective the connection of the associated switch. This condition is violated when $I_{P-D}$ and $I_{L-D}$ are diverted to $V_M<0>$. Since $I_{P-D}$ and $I_{L-D}$ are nominally constant with respect to $d_{IN}$, a simple cascode is enough to minimize this effect. In this sense, the simplest solution may be to reuse the switches 142.1 and 142.2 associated with $I_{P-D}$ and $I_{L-D}$ as cascoding devices (it should be noted that other solutions are possible).

The logic associated with these dummy sub-DACs is shown in the Table 6, indicating to which node are diverted $I_{P-D}$ and $I_{L-D}$ as a function of $d_M[0]=d_{IN}[P+L]$ (in order to determine the parity of $d_M$), $d_P$ and $d_L$. For instance, line 1 in Table 6 shows how for input codes which produce $I_{P1}=0$, the dummy $I_{p-d}$ is diverted to Vp1 in order to keep cascode transistor 118.2 in saturation. Table 6 also shows how the dummy currents are diverted to ground (Vm<0>) for input codes that imply non-zero active currents.

TABLE 6

Dummy sub-DACs truth table (3 levels of segmentation).

| $d_{IN}[N-1:0] = \{d_M, d_P, d_L\}$ | | | $I_{P-D}$ | | | $I_{L-D}$ | | |
|---|---|---|---|---|---|---|---|---|
| $d_M$[0] | $d_P$ | $d_L$ | $V_{P1}$ | $V_{P2}$ | $V_M<0>$ | $V_{L1}$ | $V_{L2}$ | $V_M<0>$ |
| 0 | 000...000 | X | ON | OFF | OFF | — | — | — |
| 0 | X | 000...000 | OFF | OFF | ON | ON | OFF | OFF |
| 0 | X | X | OFF | OFF | ON | OFF | OFF | ON |
| 0 | 111...111 | X | OFF | ON | OFF | — | — | — |
| 1 | 000...000 | X | OFF | ON | OFF | — | — | — |
| 1 | X | 000...000 | OFF | OFF | ON | OFF | ON | OFF |
| 1 | X | X | OFF | OFF | ON | OFF | OFF | ON |
| 1 | 111...111 | X | ON | OFF | OFF | — | — | — |

To prevent perturbing the transfer function, a 2-way switch is included in series with the regulated cascodes to deviate the dummy currents from the resistor string. These switches are shown as 144.1, 144.2, 144.3 and 144.4. When $I_{P-D}$ or $I_{L-D}$ are flowing through the corresponding cascode, the currents are conveniently diverted to $V_M<0>$. In practice, these additional switches consume some headroom when they drive the signal currents (an implementation with the extra switches 144 in parallel to the bank of switches 54 associated to the resistor string, instead of in series, is possible at the cost of increasing the components count and the potential leakage in the resistor string taps).

The switches associated with transistor 140.1 generating $I_{P-D}$ and $OA_{P1}$, $OA_{P2}$ are controlled by the logic signal $d_{Dp}$[2:0] associated to $I_{P-D}$ (in particular, $I_{P2}$ and $I_{P1}$ are diverted to the resistor string if, respectively, $I_{P-D}$ is not diverted to $V_{P2}$ and $I_{P-D}$ is not diverted to $V_{P1}$). Analogously, the switches associated with transistor 140.2 that generates $I_{L-D}$ and $OA_{L1}$, $OA_{L2}$ are controlled by the logic signal $d_{DL}[2:0]$ associated to $I_{L-D}$ (in particular, $I_{L2}$ and $I_{L1}$ are diverted to the resistor string if, respectively, $I_{L-D}$ is not diverted to $V_{L2}$ and $I_{L-D}$ is not diverted to $V_{L1}$).

The output impedance at $V_{DAC}$ is constant and equal to the equivalent impedance of the resistor string. Therefore, the value of the output impedance of the DAC core is, in general, significant and $V_{DAC}$ must be buffered to drive resistive loads.

Figure 11:
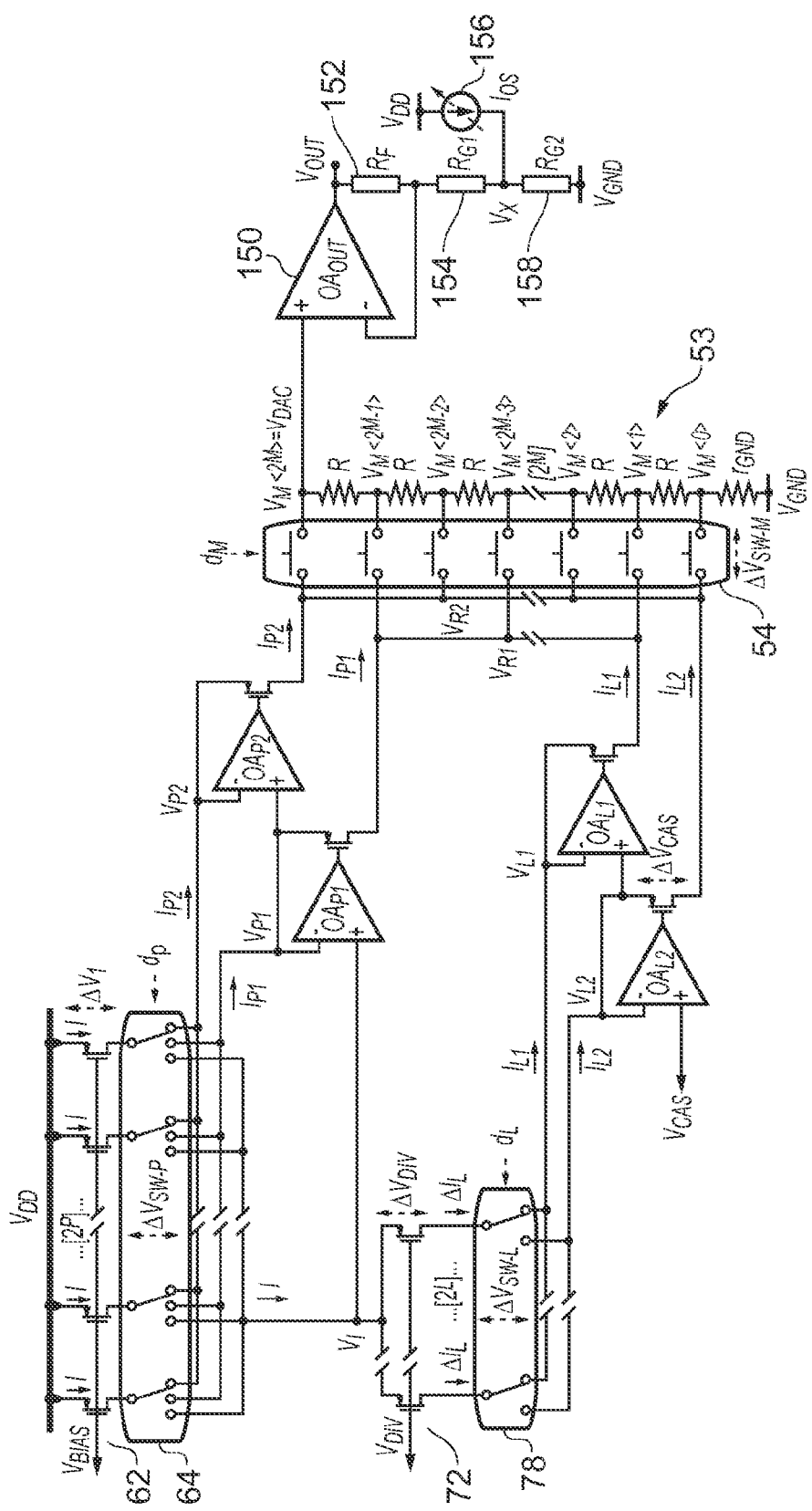
FIG. 11 shows an embodiment with an output buffer.

FIG. 11 shows a buffered version of the first embodiment of the present invention. However the buffer can be added to all embodiments. An analog buffer 150 generates the overall output of the DAC $V_{OUT}$ from the output of the DAC core $V_{DAC}$. The buffer $OA_{OUT}$ is implemented by an OA connected in non-inverted configuration and the feedback is, in general, sensed from a resistor divider comprising resistors 152, 154 and 158 to provide voltage gain. In the feedback resistor divider, a programmable current source 156 can be provided such that an offset current $I_{OS}$ is injected to resistor 158 to offer a convenient means to adjust the offset of the DAC. Other implementations are possible to buffer $V_{DAC}$.

The resulting output $V_{OUT}$ is given by:

$$V_{OUT} = \left(1 + \frac{R_F}{R_{G1} + R_{G2}}\right) \cdot V_{DAC} - \frac{R_F \cdot R_{G2}}{R_{G1} + R_{G2}} \cdot I_{OS} = G \cdot V_{DAC} - V_{OS} \quad (33)$$

where:
resistor 152 has a resistance $R_F$.
resistor 154 has a resistance $R_{G1}$.
resistor 158 has a resistance $R_{G2}$.

According to (33), $I_{OS}$ contributes to $V_{OUT}$ with an adjustable negative offset $V_{OS}$, which can be used to compensate for the positive offset caused by the voltage drop in the track impedance $r_{GND}$, along with any other offset source. This approach allows, in particular, implementing the offset calibration with negligible extra drift if the proper ratio $R_{G2}/R_{OS}$ is designed, where $R_{OS}$ is the impedance used to generate $I_{OS}$ from a voltage reference ($V_{REF}$ could be reused). Other known techniques are possible to calibrate the offset of the DAC.

In general, the Full-Scale (FS) of the DAC must be as wide as possible, the ultimate limitation being the supply range. In this buffered embodiment, the full scale output is developed in $V_{OUT}$ while a reduced input range for amplifier 150, given by $V_{DAC}=V_{OUT}/G$, may be considered; this allows simplifying the design of the input stage of amplifier 150 (which is a typical approach). In addition, this approach may also provide the necessary headroom $V_H=V_{DD}-V_{DAC}$ for the operation of the current sources, the current divider and the associated cascodes by limiting the maximum level of $V_{DAC}$ without compromising the overall full scale output of the DAC.

Hence, by the proper design of G, given by $G=1+R_F/(R_{G1}+R_{G2})$ according to (33), an efficient reuse of the headroom obtained for both the DAC core and the output buffer $OA_{OUT}$ is possible. However, G>1 involves also an amplification of the error sources associated to the DAC core and of the input referred error of amplifier 150 (notably, noise); therefore, a trade-off must be addressed when sizing G. If necessary, the low headroom embodiment of the present invention (FIG. 8) can be used as the core DAC of the buffered embodiment.

The offset of amplifier 150 only causes an offset at $V_{OUT}$; hence, it is not a source of nonlinearity. However, in practice, it may be a significant source of thermal drift.

Extension to More Levels of Segmentation

Embodiments of the present disclosure have been described, with 3 levels of segmentation. However, the teachings herein provide the capability of extending the levels of segmentation at a tolerable cost and, especially, without compromising the previously described features associated to the basic form of the present invention (namely, preservation of the dynamics and inherent monotonicity of the main sub-DAC).

Figure 12:
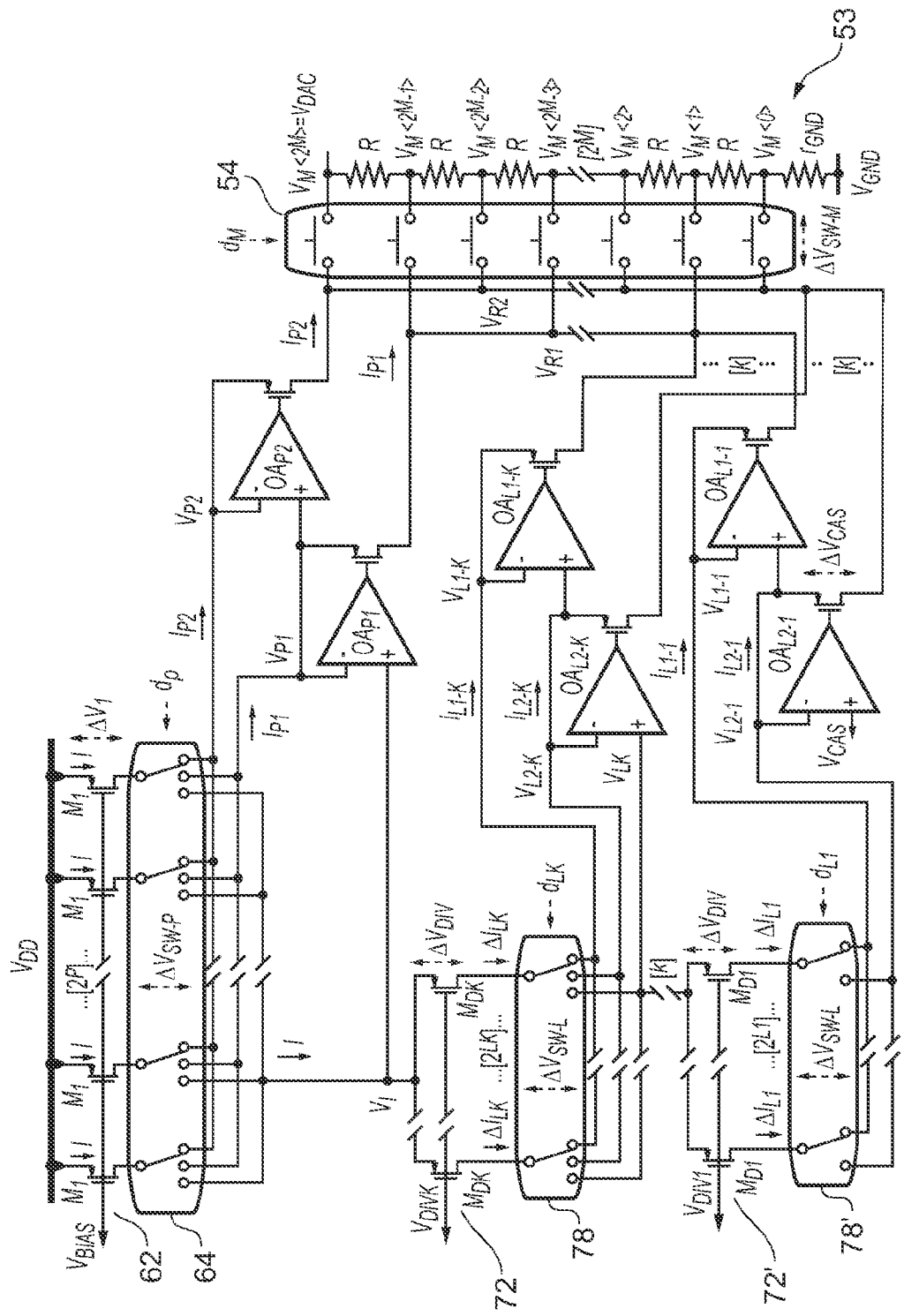
FIG. 12 shows an embodiment of a DAC with 2+K (K equal to or greater than 2) levels of segmentation.

The extension of the levels of segmentation can be accomplished by adding more implementations of the third segment, i.e. current divider sub-DACs, in series. FIG. 12 shows a generalization of the preferred practical embodiment of the present invention obtained by including k current dividers, of which the first and last are shown in series between the current source array of DAC2 and the resistor string. Therefore, a generic number s=k+2 of levels of segmentation is provided, where:

The most significant level is associated to the resistor string, it is controlled by sub-word $d_M$ of length M and its weight in the transfer function, normalized to $V_{LSB}$, is $2^{N-M}=2^{P+L_K+\ldots+L_1}$.

The following partially significant level of segmentation is associated to the current sources array, it is controlled by sub-word $d_P$ of length P and its weight in the transfer function, normalized to $V_{LSB}$, is $2^{N-M-P}=2^{L_K+\ldots+L_1}$.

The subsequent k levels (including the least significant level) are associated with the k current dividers, they are controlled by sub-words $d_{LK}, \ldots, d_{L1}$ of length $L_K, \ldots, L_1$ (respectively) and their weight in the transfer function, normalized to $V_{LSB}$, is $2^{N-M-P-L_K}=2^{L_{K-1}+\ldots+L_1}, \ldots, 2^{N-M-P-L_K-\ldots-L_1}=1$ (respectively).

As a result, the total resolution N of the generalized DAC is given by (34) and $d_{IN}$ can be expressed by (35), where the decimal equivalent of the digital words is applied.

$$N = M + P + L_K + \ldots + L_1 \quad (34)$$

$$d_{IN} = d_M 2^{P+L_K+\ldots+L_K} + \ldots + L_1 \quad (35)$$

The k pair of currents associated to the current dividers are given by (36) and (37), if $d_M$ is odd, and (38) and (39), if $d_M$ is even (where the decimal equivalent of the digital words is applied):

$$I_{L1-j} = (2^{Lj} - d_{Lj}) \cdot \frac{I}{2^{LK+\ldots+Lj}}, 1 \leq j \leq k \quad (36)$$

$$I_{L2-j} = 2^{Lj} \cdot \frac{I}{2^{LK+\ldots+Lj}}, 1 \leq j \leq k \quad (37)$$

$$I_{L1-j} = 2^{Lj} \cdot \frac{I}{2^{LK+\ldots+Lj}}, 1 \leq j \leq k \quad (38)$$

$$I_{L2-j} = (2^{Lj} - d_{Lj}) \cdot \frac{I}{2^{LK+\ldots+Lj}}, 1 \leq j \leq k \quad (39)$$

Consequently, the generic transfer function is (where the decimal equivalent of the digital words is applied):

$$V_{DAC} = \quad (40)$$
$$d_M \cdot 2^P \cdot R \cdot I + d_P \cdot R \cdot I + d_{Lk} \cdot R \cdot \frac{I}{2^{LK}} + \ldots + d_{L1} \cdot R \cdot \frac{I}{2^{LK+\ldots+L_1}}$$

Rearranging (40), the expected transfer function (41) is obtained, where $V_{LSB}$ can be identified as the expression given by (42).

$$V_{DAC} = \quad (41)$$
$$(d_M \cdot 2^{P+L_K+\ldots+L_1} + d_p \cdot 2^{L_K+\ldots+L_1} + d_{LK} \cdot 2^{L_K-1+\ldots+L_1} + \ldots + d_{L1}) \cdot \frac{I \cdot R}{2^{L_K+\ldots+L_1}}$$

$$V_{LSB} = \frac{I \cdot R}{2^{L_K+\ldots+L_1}} \quad (42)$$

The preferred logic and the presented design considerations in connection to the practical embodiments disclosed herein can be directly extended to the generalized embodiment.

In general, increasing the levels of segmentation, s, allows a reduction of the circuit area for a given resolution N. Following the approach described (as illustrated in FIG. 12) offers the possibility of implementing s>3 while keeping the desired features of the basic form of the present invention.

For each additional level of segmentation, a current divider is added in series; hence, the associated costs are:
1) Increasing the required headroom $V_H=V_{DD}-V_{DAC}$ to accommodate the operation of the additional current divider.
2) Including two additional operational amplifiers associated to the cascoding regulation of the additional current divider (which means an increase in the power consumption and a reduction of the area saved by increasing s).
3) Potentially increasing the design value of I in order to guarantee that the k consecutive current subdivisions do not produce a current level $\Delta I_{L1}$ in the last current divider comparable to the leakage, which could impact the accuracy.

Consequently, a trade-off between increasing the levels of segmentation and, mainly, headroom and power consumption exists. The required headroom $V_H$ measured from $V_{DD}$ to $V_{DAC}$ is formed by the following components (see FIG. 12):
The source-drain voltage $\Delta V_I$ of the current source PMOS.
k=s-2 source-drain voltage $\Delta V_{DIV}$ of the k current divider PMOS in series, assumed equal for simplicity.
The voltage drop associated to the current sources switches 64 ($\Delta V_{SW-P}$), the k current divider switches 73 ($\Delta V_{SW-L}$) of the divider 72 and the resistor string switches 54 ($\Delta V_{SW-M}$), assumed equal for simplicity.
The source-drain voltage drop $\Delta V_{CAS}$ of the regulated cascode PMOS associated to the least significant current divider (the rest of cascodes are in parallel to a current divider, thus not contributing to the headroom).
The total $V_H$ is, for the general case:

$$V_H = \Delta V_I + \Delta V_{SW-P} + k \cdot (\Delta V_{DIV} + \Delta V_{SW-L}) + \Delta_{CAS} + \Delta V_{SW-M} \quad (43)$$

From (43), the additional headroom $\Delta V_H$ required for increasing $\neq k$ levels of segmentation is $\Delta V_H = \Delta k \cdot (\Delta V_{DIV} + \Delta V_{SW-L})$; hence, increasing s by 1 ($\Delta k = 1$) involves increasing the required headroom by $\Delta V_H = \Delta V_P + \Delta V_{SW-L}$ (which matches the voltage drop associated to one current divider).

This cost in headroom can be mitigated by using the low headroom embodiment previously presented (see FIG. 8). On the other hand, using current dividers in parallel allows increasing the level of segmentation without consuming additional headroom, but the complexity and the potential sources of error are increased.

From FIG. 12 the following component count can be computed (for s=k+2 levels of segmentation):

Resistors R in the string: $\#[R]=2^M$.
Current source MOS $M_I$: $\#[M_I]=2^P$.
Current divider MOS $M_{Dj}$: $\#[M_{Dj}]32\ 2^{L_K}+\ldots+2^{L_1}$.
Switches: $\#[SW]=(2^M+1)+3\cdot(2^P+2^{L_K}+\ldots+2^{L_2})+2\cdot 2^{L_1}$, where the 3-way and 2-way switches are counted as 3 and 2 switches, respectively.
Regulated cascode buffers OA: $\#[OA]=2\cdot(k+1)$.

These figures reflect the potential for area reduction offered by the present invention.

Biasing

As established previously, the DAC core needs some biasing voltages:
A bias voltage for the current source array, $V_{BIAS}$.
A biasing voltage for each current divider, $V_{DIVX}, \ldots, V_{DIV1}$.
A biasing voltage for the cascode between the last current divider and the resistor string, $V_{CAS}$.

These voltages can be generated by a biasing circuit. Several implementations are possible. Some possibilities are described here merely for the sake of completeness. The basic approach is to define the biasing voltages ($V_{BIAS}$, $V_{DIV}$ and $V_{CAS}$) from a branch which replicates the path of a current source I from $V_{DD}$ to the resistor string.

Figure 13:
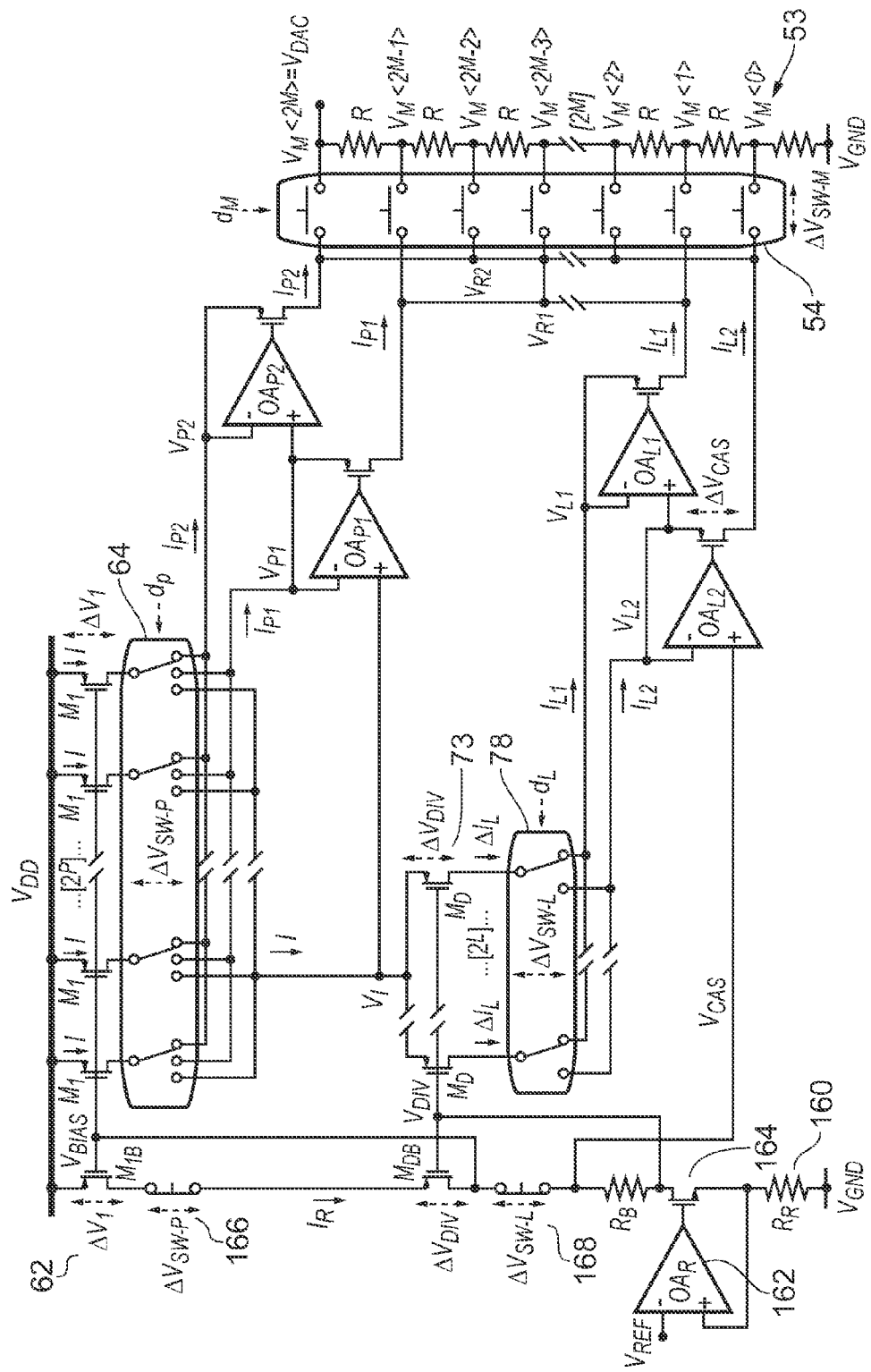
FIG. 13 shows a biasing circuit for use with segmented DACs of this disclosure, the biasing circuit being shown in combination with the DAC of FIG. 7

FIG. 13 illustrates this approach. The reference voltage $V_{REF}$ is forced into a terminal of a grounded resistor 160 having a value $R_R$, thus generating a current $I_R$. For instance, an Operational Amplifier 162 driving a MOSFET 164 can be used (as in FIG. 13). The current $I_R$ flows from $V_{DD}$ through a self-biased MOSFETs $M_{IB}$ to generate $V_{BIAS}$ and, $M_{DB}$ to generate $V_{DIV}$.

In order to define conveniently these biasing voltages MOSFETS $M_{IB}$ and $M_{DB}$ are kept in saturation with the desired margin, experiencing (ideally) the source-drain voltage drop $\Delta V_I$ and $\Delta V_{DIV}$ associated with the current source MOSFET $M_I$ and current divider MOSFET $M_D$, respectively. Some dummy switches 166 and 168 may be included in the path of $I_R$ for mimicking the voltage drop $\Delta V_{SW-P}$ and $\Delta V_{SW-L}$ across the corresponding active switches. To limit the amount of headroom required by $\Delta V_I$ and $\Delta V_{DIV}$, the gate of $M_{IB}$ is connected to the drain of $M_{DB}$ and the gate of $M_{DB}$ is connected after a conveniently sized resistor $R_B$.

The current sources 62 track the thermal drift of $R_R$; then, if $R_R$ is implemented by the same material as the resistors R of the resistor string, which is the preferred approach, the thermal drift in $V_{DAC}$ is essentially cancelled because the ratio $R/R_R$ is preserved.

The magnitude of $I_R$ can be selected as a trade-off between, mainly, power dissipation and noise. The noise associated to $I_R$ is conveyed by the $2^P$ current sources I to $V_{DAC}$. This contribution can be limited by decreasing the gain factor $g_I=I/I_R$ associated to the mirroring between $I_R$ and I; in other words, by having $g_I<1$ which, for a given I, means increasing $I_R$ at the cost of power dissipation. The device $M_{IB}$ ($M_{DB}$) (and the associated dummy switch) is sized with the desired scaling between I ($\Delta I_L$) and $I_R$ from the geometry of the matched devices $M_I$ ($M_D$), which are sized, essentially, for matching. An error in the ratio $g_I=I/I_R$ produces a gain error in the transfer function which can be calibrated; an error in the ratio $\Delta I_L/I_R$ would have a negligible effect.

A difference between $I_R$ and the nominal current $2^P \cdot I$ that will flow eventually through the resistor string may produce a gain error because the self-heating is not cancelled in the ratio $R/R_R$. This gain error can be relatively easily calibrated and it is not a source of drift; therefore, its importance is secondary. It can be minimized by considering $I_R \approx 2^P \cdot I$.

Moreover, the fact that the current through a given resistor R varies from 0 to $2^P \cdot I$ while the current flowing through $R_R$ is fixed at $I_R$ causes a non-linearity induced by the input dependent self-heating. This effect resets after the current through a given R reaches $2^P \cdot I$ and, thus, its significance in the transfer function is limited to the level $2^N/2^M = 2^{P+K_K+\ldots+L_1}$. This can be mitigated by considering an input dependent $I_R$; however, the linearity improvement does not compensate, in practice, the additional complexity.

Figure 14:
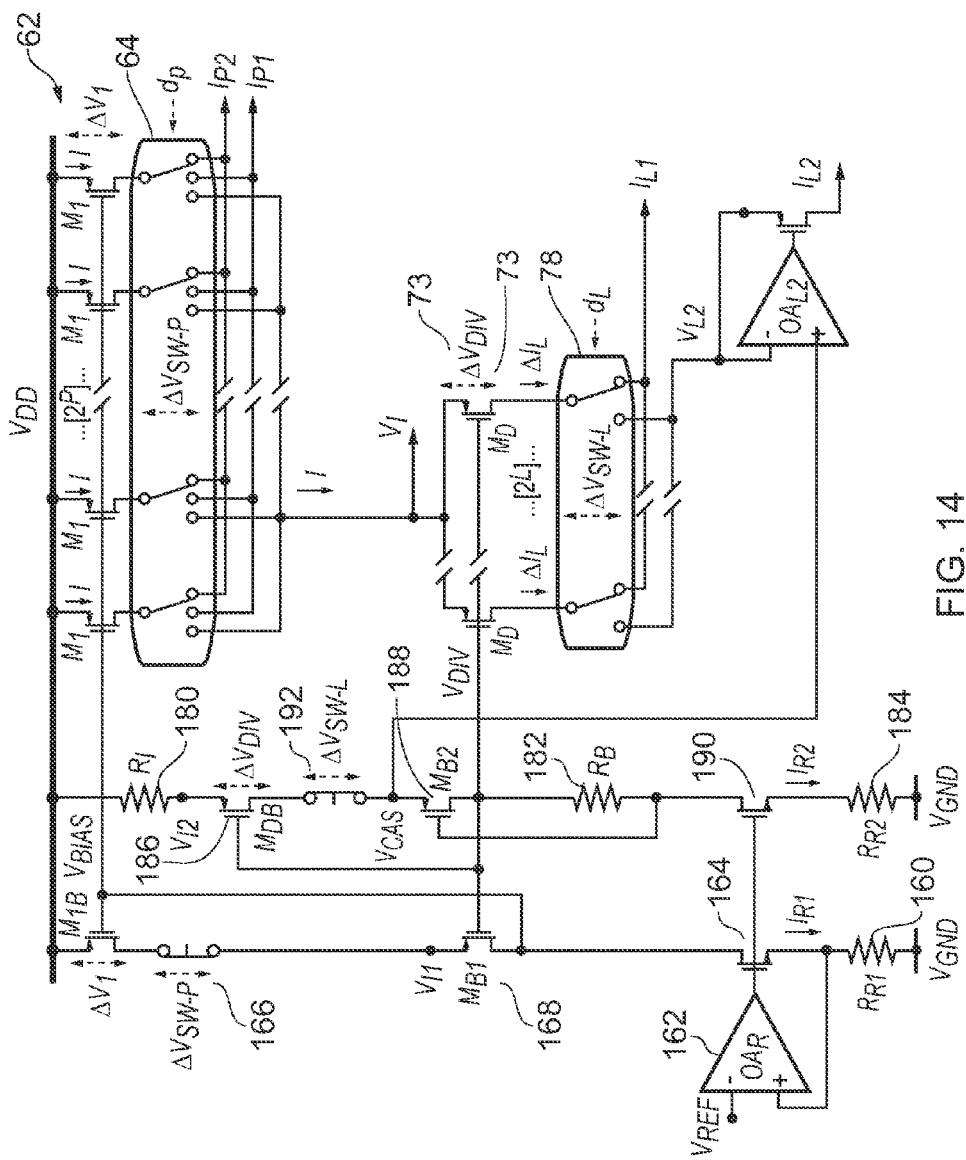
FIG. 14 shows a further embodiment of a biasing circuit.

The circuit shown in FIG. 13 does not accurately control the headroom allocated to the current source array and the current divider. An approach that solves this limitation, at the cost of increasing the power dissipation and (marginally) the area, is shown in FIG. 14. Here a second current flow path from Vdd to ground is provided by resistors 180, 182 and 184 having values RI, RB and RR2 respectively and PMOS FETs 186 and 188 arranged in series with one another. A first terminal of resistor 180 is connected to Vdd. A second terminal of resistor 180 is connected to the source of transistor 186. The drain of transistor 186 is connected to the drain of transistor 188 via dummy switches 192 (transistors biased permanently on). The drain of transistor 188 is connected to one terminal of resistor 182, to the gate of transistor 186, the gate of transistor $M_{B1}$ and the gates of the transistors 73. A second terminal of the resistor 182 is connected to the drain of an NMOS transistor 190 and to the gate of transistor 188. The source of the transistor 190 is connected to ground via resistor 184. The gate of transistor 190 is connected to the gate of transistor 164.

The value of $V_I$, which establishes the headroom for the operation of the current source array (second segment), can be defined by properly sizing a resistor 180 of value $R_I$. In particular, the following design relation applies:

$$V_{DD} - V_{I2} = R_I \cdot I_{R2} \approx V_{DD} - V_{I1} \approx V_{DD} - V_i = \Delta V_I + \Delta V_{SW-P} \quad (44)$$

The biasing circuitry also establishes the size of $V_{LSB}$ from $V_{REF}$. The value of $I_{R1}$ is given by:

$$I_{R1} = \frac{V_{REF}}{R_{R1}} = g_I \cdot I \quad (45)$$

From (45) and (18), the following design condition is deduced for the basic form of the present disclosure (taking into account that $V_{LBS} = V_{REF}/2^N = V_{REF}/2^{M+P+L}$):

$$\frac{R}{R_{R1}} = \frac{g_I}{2^{M+P}} \quad (46)$$

An additional current $I_{R2}$ is needed, thus increasing the power consumption. However, a small value for $I_{R2}$ can be considered since $I_{R2}$ is used only to define cascoding voltages and, thus, a trade-off with noise does not exist. In FIG. 14, $I_{R2}$ is generated by reusing the output of amplifier 162 to drive a MOSFET 190 with a resistor 184 of value $R_{R2}$ at its source, replicating the regulated current source. The proper scaling between the MOS and the resistors must be applied to obtain the desired $I_{R2}$. The error caused by $I_{R2}$ being generated in open-loop (which is a trade-off with power and area saving) is not significant because $I_{R2}$ is used to define cascoding voltages and headroom components. Other approaches to generate $I_{R2}$ from $I_{R1}$ are possible.

If the resistors in the biasing circuitry ($R_{R1}$, $R_{R2}$, $R_I$ and, less relevantly, $R_B$) are implemented by the same material, the immunity of the biasing voltages respect to process and temperature variations improves.

In any case, the potential offset or gain error from the biasing circuitry would translate into a gain error in $V_{DAC}$, while the corresponding drift would produce gain drift in $V_{DAC}$. In particular, the offset of $OA_R$ and its drift produces gain error in the transfer function and gain drift, respectively.

The coupling between the biasing of the current sources, current divider(s) and cascodes with the input dependent signals can be made negligible. As a result, the biasing voltages generated by a biasing circuitry can be shared by several DAC cores without a significant impact on the dynamics and, notably, on crosstalk.

Family of DACs with a Current Steering Sub-DAC as a Primary Sub-DAC

Figure 15:
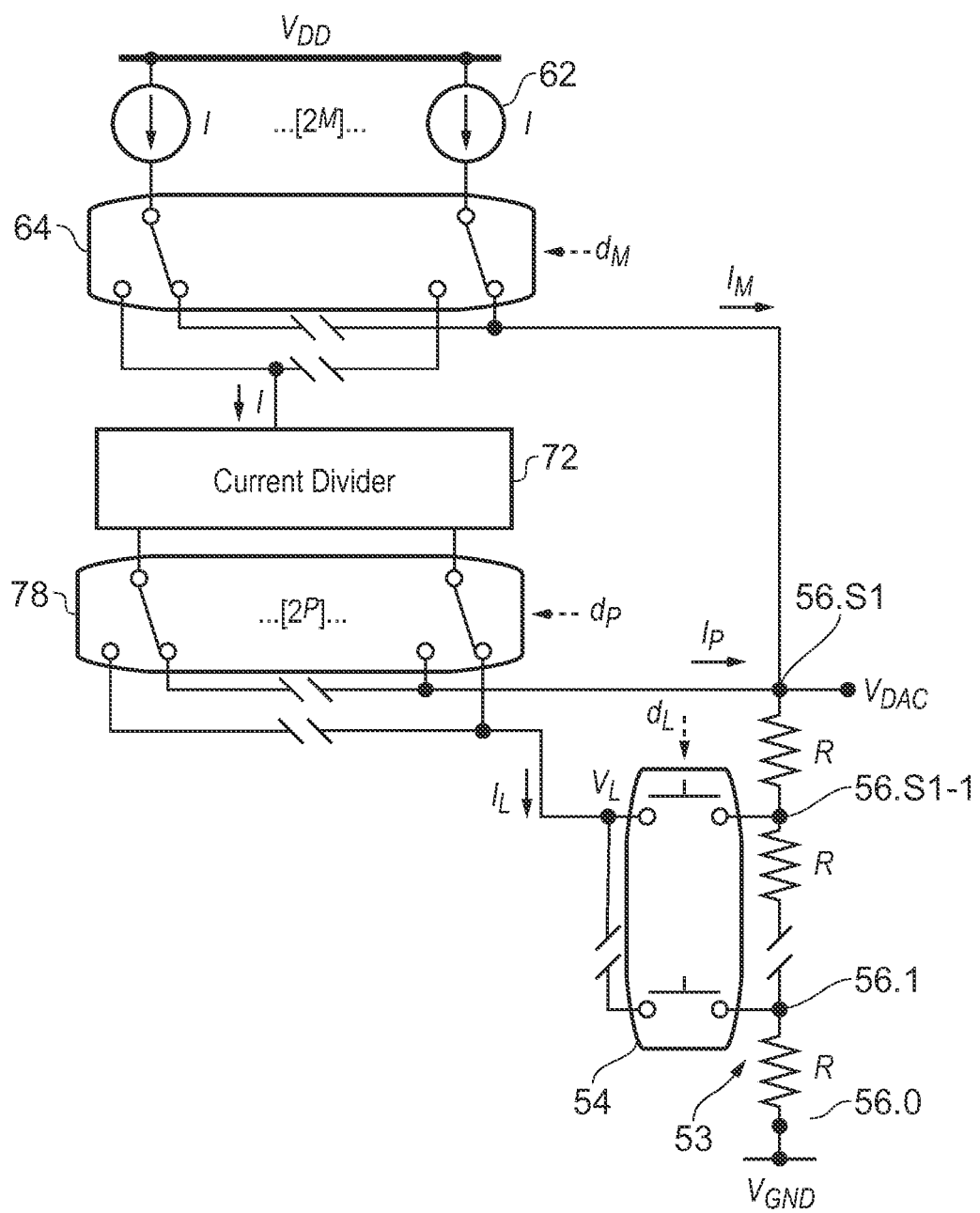
FIG. 15 shows an embodiment of a DAC where the second segment, for example as a current source sub-DAC converts the most significant part of the digital input word.

FIG. 15 shows a block diagram of a further DAC core architecture where the 3 levels of segmentation previously described can be recognized. In this variation the order of precedence in the segments or sub-DACs has been changed. This represents using the connection matrix 30 of FIG. 1 to connect the segments in a different connection topology.

Figure 16:
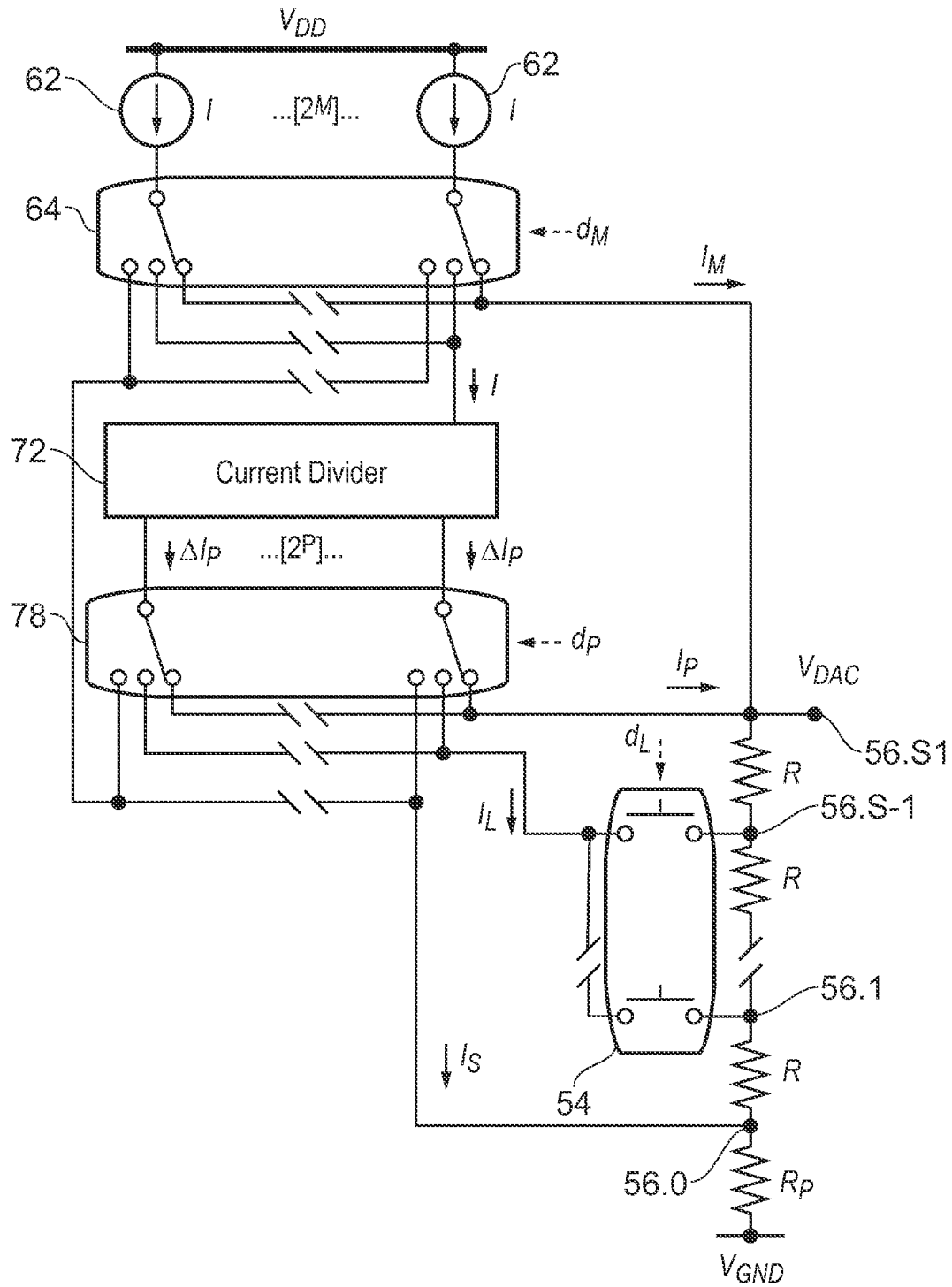
FIG. 16 shows a modification to the arrangement of FIG. 15.

As before, one segment formed by a resistor string 53 of $S1 = 2^L$ matched resistors of nominal value R as described with respect to FIG. 4 has its bottom terminal 56.0 coupled to a ground potential $V_{GND}$ and, at the top terminal 56.S+1, the output of the DAC core $V_{DAC}$ is developed as a function of $d_{IN}$ according, ideally, to (1). For diagrammatic simplicity any parasitic resistance Rp in the path to ground has not been shown as an additional component. Furthermore, node 56.S1 is not switched in this configuration. The transistor switch 54.S1 that would normally be associated with this node may be omitted or the transistor switch may have its gate kept at a voltage to hold the transistor in a conducting state. Turning our attention to node 56.0, the designer has options to omit a current path to this node (as shown in FIG. 15) or to provide such a current path as shown in FIG. 16. This choice depends on how the designer wishes to handle digital input codes for which some of the previously described currents would be nominally zero, and whether under these conditions the current sources are inhibited from passing a current (as would be the case in the circuit shown in FIG. 15) or whether they can continue to pass current, as is the case with the circuit shown in FIG. 16, and as will be described in further detail later.

An analog current $I_M$ controlled by $d_M$ and an analog current $I_P$ controlled by $d_P$ are injected into the top terminal 56.S+1 of the resistor string. A current $I_L$ can be selectively switched to any of the $2^L - 1$ intermediate terminals of the resistor string by means of a bank of switches 54 controlled by $d_L$ which connect a common terminal $V_L$ to each intermediate terminal of the resistor string.

An array of $2^M$ matched current sources 62 of nominal value I can be selectively connected to terminal $V_{DAC}$ (contributing to $I_M$) or diverted to a current divider by a bank of switches controlled by $d_M$. In normal operation, the current $I_M$ is a multiple of I defined by $d_M$ following a thermometric logic and given by (47), where the decimal equivalent of the digital word is applied.

$$I_M = d_M \cdot I \quad (47)$$

In normal operation, only one of the current sources 62 producing a current I (selected from the information provided by $d_M$) is connected to the current divider for any $d_M$; hence, the nominal value of the current injected into the current divider is independent of $d_{IN}$ and equal to I.

The plurality of matched current sources may be replaced by a current source and current divider/steering circuit such as shown in FIG. 4.

The current divider 72 divides its input current (whose magnitude is I) into $2^P$ matched currents $\Delta I_P$ whose value is given by (48). A bank of switches controlled by $d_P$ allows to selectively connect any of these current subdivisions to terminal $V_{DAC}$ (contributing to $I_P$) or to terminal $V_L$ (contributing to $I_L$).

$$\Delta I_P = \frac{I}{2^P} \quad (48)$$

In normal operation, the current $I_P$ is a multiple of $\Delta I_P$ defined by $d_P$ following a thermometric logic and given by (49), where the decimal equivalent of the digital word is applied.

$$I_P = d_P \cdot \Delta I_P \quad (49)$$

In normal operation, only one of the current subdivisions $\Delta I_P$ (selected from the information provided by $d_P$) is connected to terminal $V_L$ for any $d_P$; therefore, the nominal value of $I_L$ is independent of $d_{IN}$ and given by (50).

$$I_L = \Delta I_P = \frac{I}{2^P} \quad (50)$$

The current $I_L$ flows into one of the intermediate terminals of the resistor string by means of the associated switch of the previously described bank of switches controlled by $d_L$.

The output voltage $V_{DAC}$ of the DAC core is generated by the combined ohmic effect, in the resistor string, of the previously described currents:

$I_M$, which is controlled by $d_M$ and injected into the top of the resistor string (thus, it flows through an impedance $2^L \cdot R$ to ground).

$I_P$, which is controlled by $d_P$ and injected into the top of the resistor string (thus, it flows through an impedance $2^L \cdot R$ to ground).

$I_L$, which is fixed and injected into one of the intermediate terminals of the resistor string selected by $d_L$ (thus, it flows through an impedance $d_L \cdot R$ to ground, where the decimal equivalent of the digital word is applied).

Consequently, the transfer function is (where the decimal equivalent of the digital words is applied):

$$V_{DAC} = I_M \cdot 2^L \cdot R + I_P \cdot 2^L \cdot R + I_L \cdot d_L \cdot R \quad (51)$$

Applying (47), (48), (49) and (50) in (51), the transfer function can be expressed as:

$$V_{DAC} = \quad (52)$$
$$2^L \cdot \left(d_M + \frac{d_P}{2^P}\right) \cdot I \cdot R + \frac{d_L}{2^P} \cdot I \cdot R = (2^{P+L} \cdot d_M + 2^L \cdot d_P + d_L) \cdot \frac{I \cdot R}{2^P}$$

Comparing (52) with the ideal transfer function given by (3), $V_{LSB}$ can be identified as:

$$V_{LSB} = \frac{I \cdot R}{2^P} \quad (53)$$

Applying (53) in (52), the ideal transfer function (3) is obtained. Consequently, the DAC core architecture shown in FIG. 15 performs the expected DAC conversion with 3 levels of segmentation.

A decoding circuit 20 (shown in FIG. 1) accepts the digital input word $d_{IN}$ and generates the control signals which drive the switches following a specific logic (not formally described here). The preferred logic is such that, once the current subdivision $\Delta I_P$ making the role of $I_L$ has reached the top intermediate terminal 56.S1-1 of the resistor string ($d_L$ is maximum), said $\Delta I_P$ is directly diverted to terminal 56.S1 outputting $V_{DAC}$ as part of $I_P$ for an increase in $d_{IN}$ by 1. Analogously, once the current source I being subdivided by the current divider has been fully conveyed to terminal $V_{DAC}$ as $I_P$ except for one remaining $\Delta I_P$ ($d_P$ is maximum and $I_P = I - \Delta I_P$), said I is, for an increase in $d_{IN}$ by 1, directly diverted to terminal $V_{DAC}$ as part of $I_M$ and one of the spare current sources I is connected to the current divider.

Avoiding Perturbation of the Current Sources

As noted before as one of the objects of the present disclosure is to prevent the segmentation technique from deteriorating the dynamic of the resulting segmented DAC respect to the original DAC. In the DAC core architecture shown in FIG. 15, the original DAC can be considered the resistor string which, in general, offers reasonably good dynamics. Therefore, the switching associated to the extra levels of segmentation (in this case, the switching of the current sources I and the current subdivisions $\Delta I_P$) should not perturb the nodes of the resistor string. This can be accomplished by arranging that the devices generating I and $\Delta I_P$ are always carrying their nominal signal level.

However, some current I and $\Delta I_P$ is not injected to the resistor string 52 depending on the value of $d_{IN}$. If an alternative path is not provided for those spare currents, they will be extinguished depending on $d_{IN}$, thus jeopardizing the dynamics during the transitions for which they have to recover their nominal value. Therefore, the DAC core architecture shown in FIG. 15 can be modified as show in in FIG. 16 to provide an extra path where the spare current $I_S$, made up of the unused current sources I and $\Delta I_P$, can flow.

This current $I_S$ is captured by replacing the 2-way switches associated to the current sources array and the current divider by 3-way switches, as illustrated in FIG. 16. The spare current $I_S$ is generated from $d_M$ and $d_P$, and its value (according to the operation previously described) is given by:

$$I_S = (2^M - d_M) \cdot I - (d_P + 1) \cdot \frac{I}{2^P} \quad (54)$$

The bottom terminal 56.0 of the resistor string is coupled to a ground terminal $V_{GND}$ (as described previously). A parasitic interconnection impedance Rp between terminal $V_{GND}$ and the bottom terminal of the string always exists. If the current flowing through Rp varies with $d_{IN}$, $V_{DAC}$ experiences, in general, a non-linearity.

To avoid this potential source of error, $I_S$ can be injected into the bottom terminal of the resistor string (as is shown in FIG. 16) in order to make the current flowing through Rp constant (in particular, equal to $2^M \cdot I$) and, hence, independent of $d_{IN}$, causing only an offset error.

In addition to guarantee that I and $\Delta I_P$ are not extinguished for any $d_{IN}$, keeping them stable during the $d_{IN}$ transitions is necessary to not perturb the resistor string dynamics. This involves following a switching sequence such that all the branches associated to any of the 3-way switches 64 and 72 are not simultaneously open by means of overlapping control signals. Such techniques are well known in the state-of-the-art and, hence, further details are not included here.

One object of the present disclosure is to extend the inherent monotonicity of the original DAC (in this case, the resistor string) to the resulting segmented DAC. According to the operation previously described, a monotonic transfer function $V_{DAC}$ is generated irrespective the mismatch of the current sources I, the current subdivisions $\Delta I_P$ and/or the resistors R of the string (assuming that these mismatches are independent enough of the signal levels or, equivalently, of $d_{IN}$). This inherent monotonicity is guaranteed by the following facts:

- Any increase (decrease) of $d_L$ means injecting a substantially fixed current $I_L>0$ into a terminal located upwards (downwards) in the resistor string; hence, the new $V_{DAC}$ cannot be smaller (bigger) than the previous $V_{DAC}$ due to the resistor string structure, assuming R≥0.
- Any increase (decrease) of $d_P$ means injecting more (less) current into the top of the string; hence, the new $V_{DAC}$ cannot be smaller (bigger) than the previous $V_{DAC}$ due to the thermometric logic of the current divider, assuming $\Delta I_P$ 0.
- Any increase (decrease) of $d_M$ means injecting more (less) current into the top of the string; hence, the new $V_{DAC}$ cannot be smaller (bigger) than the previous $V_{DAC}$ due to the thermometric logic of the current divider, assuming I≥0.
- Any current subdivision $\Delta I_P$ being switched between the intermediate terminals of the resistor string following an increasing (decreasing) $d_{IN}$ variation is eventually injected into the top terminal $V_{DAC}$ (the ground terminal $V_{GND}$) and kept in that state for any increasing (decreasing) $d_{IN}$ variation; hence, the new $V_{DAC}$ for an increasing (decreasing) transition between the first and the second segmentation levels cannot be smaller (bigger) than the previous $V_{DAC}$ due to the selected logic.
- Any current source I being subdivided by the current divider following an increasing (decreasing) $d_{IN}$ variation is eventually injected into the top terminal $V_{DAC}$ (the ground terminal $V_{GND}$) and kept in that state for any increasing (decreasing) $d_{IN}$; hence, the new $V_{DAC}$ for an increasing (decreasing) transition between the second and the third segmentation levels cannot be smaller (bigger) than the previous $V_{DAC}$ due to the selected logic.

Therefore, the described DAC core architecture is monotonic irrespective the mismatch of the components and it is guaranteed monotonic if said mismatch is independent of $d_{IN}$. In practice, this involves generating the current sources I and the current subdivisions $\Delta I_P$ in such a way that they are insensitive to the signal level in the resistor string, which, in general, varies significantly with $d_{IN}$. Consequently, the output impedance of the cells generating I and $\Delta I_P$ must be high enough to be insensitive to their, potentially variable, output voltage.

Figure 17:
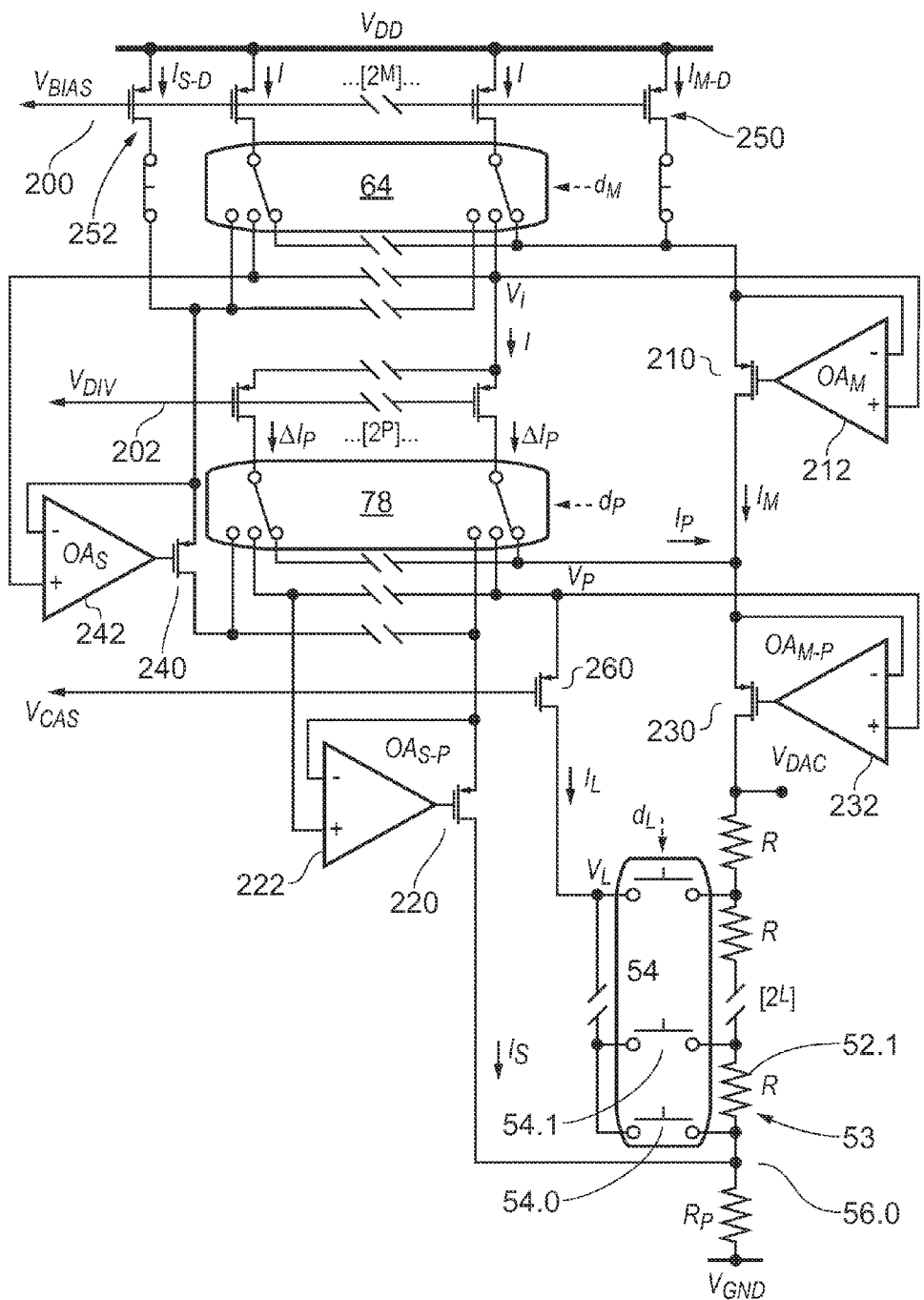
FIG. 17 shows an arrangement based on FIG. 16 and including active cascode circuits.

In a preferred embodiment, both the current sources I and the current subdivisions $\Delta I_P$ are implemented by a MOSFET devices conveniently biased and matched, as it is represented in FIG. 17. To increase the output impedance of these basic cells, a cascoding technique can be employed, which involves inserting a cascoding MOS in the drain of the current source and the current divider MOS transistors to force it to a convenient biasing value. Since the current sources and the current divider are in series, 2 levels of cascoding are necessary.

An important function of the cascoding, in addition to isolating form the signal level in the resistor string, is to force a similar voltage at the drain of the different current sources irrespective the path enabled by their associated 3-way switch to improve the matching (otherwise the channel length modulation can produce an undesired current variation depending on the state of the switch because the drain voltage would be, in general, significantly different) and, analogously, for the current divider MOS.

An option is to cascode each relevant MOS by a dedicated cascoding device conveniently biased and inserted between the MOS to be isolated and the corresponding switch. This is feasible because the nominal current is always flowing through the cell and, hence, the cascoding MOS connected in series can be kept in saturation for any $d_{IN}$ thus providing a proper cascoding. The number of extra devices to implement the cascoding following this approach would be $2^M+2^P$. However, as discussed hereinbefore the switches can be reused as cascodes when they are turned on by driving its gate to the biasing of the cascode instead of to a digital signal. Since, for all the 3-way switch, one of the branches is on for any given $d_{IN}$, a proper cascoding would be always performed.

Another option to save components is cascoding after the switches, once their outputs are jointed to form the different currents. This approach is shown in FIG. 17, where MOS devices 210, 220, 230 and 240 are included to cascode the branches associated to $I_L$, $I_P$ and $I_S$ at the level of the current divider, and $I_M$ and $I_S$ at the level of the current source array (an explicit cascode for the input current of the current divider is not necessary because the MOS transistors implementing the current divider are indirectly doing such a function, especially assuming the normal operation where the nominal current across these MOS transistors is constant). Hence, the number of cascoding MOS devices is reduced, although their size needs to be increased to accommodate the increased current level (not necessarily in the same proportion as the reduction in the number of devices, thus offering a potential area saving).

In the branches whose current varies ($I_P$, $I_M$ and $I_S$), a regulated cascode is used to prevent the cascoded voltage from varying with the input dependent currents (which would deteriorate severely the matching of the current sources I and the current subdivisions $\Delta I_P$). The regulated cascodes are implemented by an Operational Amplifiers 212, 222, 232 and 242 in negative feedback configuration driving the gate of the cascoding MOS (other implementation are possible).

The two regulated cascodes 210 and 240 associated with the current sources are redundant from the isolation point of view (because at the current divider level there are cascodes in series) but they are desirable to force a similar voltage in the drain of the current source MOS transistors irrespective the state of the associated switch. As a result, the approach of reusing the switches as cascoding devices may be feasible for the current sources, once dedicated cascodes are used in the braches associated to the current divider (which represents a trade-off between accuracy and power).

The operational amplifiers used in the regulated cascodes in FIG. 17 can be implemented very efficiently in terms of area and power because both their static and dynamic performance is relatively undemanding. In particular, $V_{DAC}$ is significantly insensitive to the input referred error (including offset, non-linearity, drift, noise . . . ) associated to these Operational Amplifiers because the potential error would be transmitted to $V_{DAC}$ by the channel length modulation of the cascoded transistors whose influence is negligible as long as they remain in saturation. This significantly simplifies the design of these Operational Amplifiers. The use of regulated cascodes also enhances the cascoding in the presence of any other perturbation due to the negative feedback and the gain of the amplifier and, hence, the obtained accuracy would be, in general, better than that associated to simple cascodes.

In the braches where the current is nominally constant ($I_L$) a simple cascode can provide enough accuracy (however, if additional accuracy is required, a regulated cascode could be used at the cost of an extra amplifier). This applies to the cascoding of node $V_P$ to isolate it form the input dependent voltage $V_L$.

The bias voltage $V_{CAS}$ used to drive this cascode is designed to provide the desired value in $V_P$ for the operation of the current divider (clearly, $V_P > V_{DAC}$ with enough margin is a necessary condition to ensure a proper current division). The resulting voltage at $V_P$ is sensed by the Operational Amplifiers associated with the regulated cascodes of the current divider ($OA_{M-P}$, $OA_{S-P}$) to force their respective cascoded nodes to $V_P$, improving the current subdivision matching.

The voltage $V_{DIV}$ used for biasing the current divider MOS is designed to provide the desired value in $V_I$ for the operation of the current sources (in this case, $V_I > V_P$ with enough margin to keep the current divider MOS transistors well in saturation but without compressing to much the headroom available for the current sources I). The resulting voltage at $V_I$ is sensed by the Operational Amplifiers associated to the regulated cascodes of the current sources array ($OA_m$, $OA_S$) to force their respective cascoded nodes to $V_I$, improving the current source generation matching.

A biasing circuit (not shown in FIG. 17 but described earlier) generates the voltages $V_{CAS}$, $V_{DIV}$ and $V_{BIAS}$ from the analog reference voltage $V_{REF}$ of the DAC. The biasing voltage $V_{BIAS}$ is used to generate the matched current sources I; a condition for the definition of $V_{LSB}$ can be established (which is relevant for designing the size of I+R):

$$V_{LSB} = \frac{V_{REF}}{2^N} = \frac{I \cdot R}{2^P} \rightarrow I \cdot R = \frac{V_{REF}}{2^{N-P}} = \frac{V_{REF}}{2^{M+L}} \quad (55)$$

In practice, $V_{BIAS}$ is generated from a current obtained by forcing $V_{REF}$ in the terminals of a resistor $R_{REF}$. Therefore, I tracks the thermal drift of $R_{REF}$ and, if $R_{REF}$ is implemented by the same material as the resistors R of the resistor string, the thermal drift in $V_{DAC}$ is substantially cancelled because the ratio $R/R_{REF}$ is preserved.

Some dummy currents are used to guarantee a minimum current level flowing through the cascoding devices irrespective $d_{IN}$, thus improving static and dynamic operation of the cascode circuits. In particular, as it is illustrated in FIG. 17, a dummy current $I_{M-D}$ is generated by the transistor 250 and selectively injected into $I_M$ and a dummy current $I_{S-D}$ is generated by the transistor 252 and selectively injected into $I_S$. Since $I_M$ and $I_S$ goes to zero for different $d_{IN}$, a single dummy current can be used to guarantee $I_M > 0$ and $I_S > 0$ by injecting it into the necessary branch according to the value of $d_{IN}$.

In order to obtain $I_L > 0$ for any $d_L$ thereby keeping cascode transistor 260 in saturation, current can be directed to the bottom of the resistor string by switch 54.0. Thus current can flow through the associated cascoding device even when it is not necessary from the transfer function point of view (being, in this case, $I_L$ diverted by said extra switch).

Figure 18:
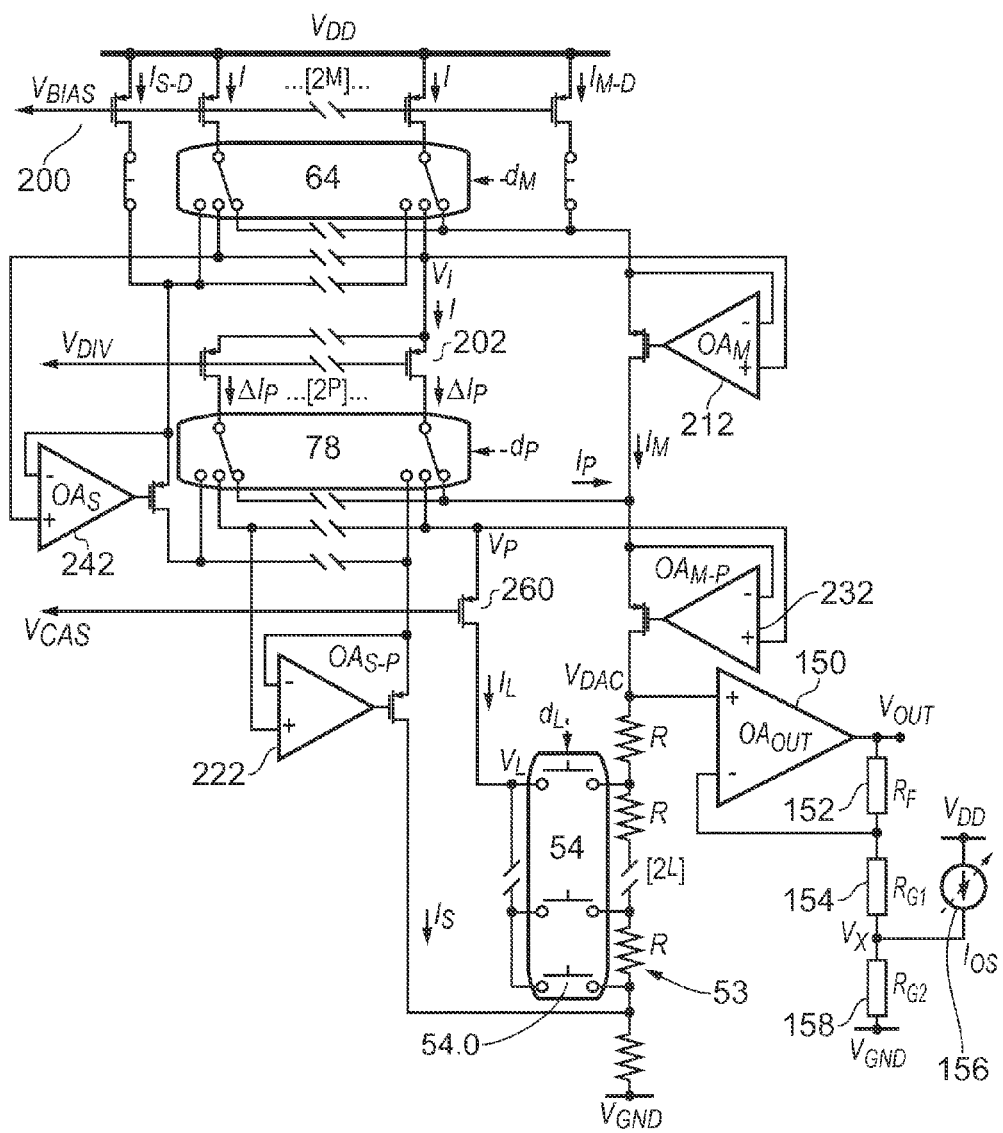
FIG. 18 show the arrangement of FIG. 17 with an added output buffer.

The output impedance at $V_{DAC}$ is constant and equal to the equivalent impedance of the resistor string. Therefore, the value of output impedance of DAC core is, in general, big and $V_{DAC}$ must be buffered to drive resistive loads. FIG. 18 shows a buffered version of this embodiment. The buffer operates as described earlier.

Providing Further Levels of Segmentation

Embodiments of the basic form of the second variation of the present disclosure have been described, which are limited to 3 levels of segmentation. However, a target of the present invention is to provide the capability of extending the levels of segmentation at a tolerable cost and, especially, without compromising the previously described features associated to the basic form of the present invention (namely, preservation of the dynamics and inherent monotonicity of the original DAC).

Figure 19:
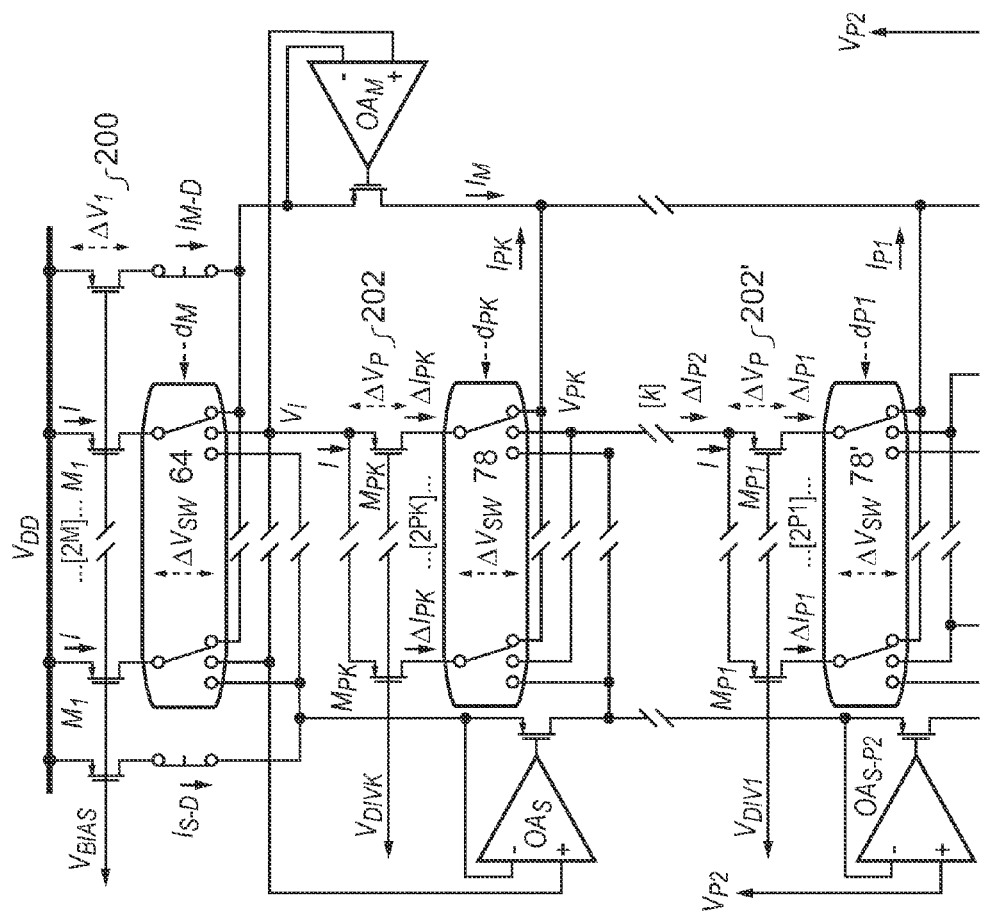
FIG. 19 shows a circuit based on FIG. 18 with 2+K (K greater than or equal to 2) levels of segmentation, where greater than three levels of segmentation is achieved by one or more repetitions of the current steering DAC (third segment) of FIG. 3.
Figure 19:
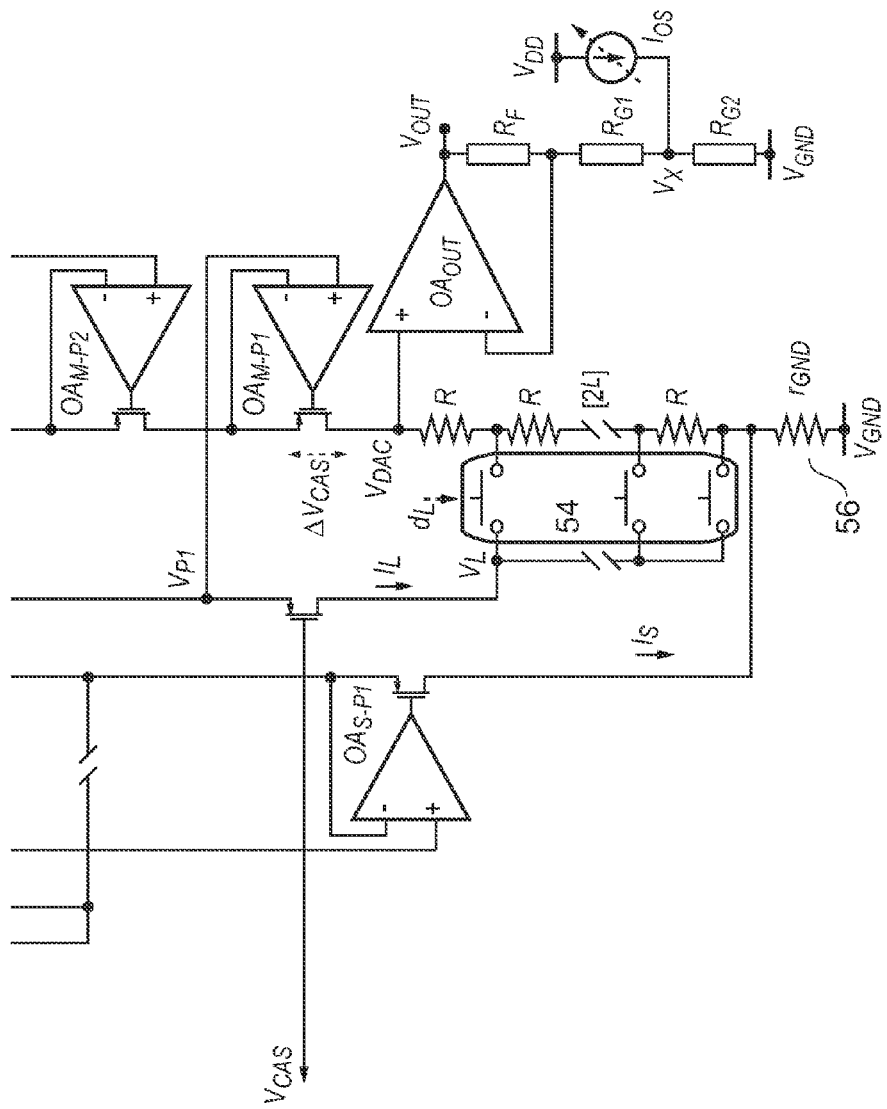

The extension of the levels of segmentation can be accomplished by adding current dividers in series. FIG. 19 shows a generalization of the preferred embodiment of the second form of the present disclosure obtained by including k current dividers in series between the current source array and the resistor string. Therefore, a generic number s=k+2 of levels of segmentation is provided, where:

The most significant level is associated to the current sources array, it is controlled by sub-word $d_M$ of length M and its weight in the transfer function, normalized to $V_{LSB}$, is $2^{N-M} = 2^{P_k + \ldots + P_1 + L}$.

The subsequent k partially significant levels are associated to the k current dividers, they are controlled by sub-words $d_{Pk}, \ldots, d_{P1}$ of length $P_k, \ldots, P_1$ (respectively) and their weight in the transfer function, normalized to $V_{LSB}$, is $2^{N-M-P_k} = 2^{P_{k-1} + \ldots + P_1 + L}, \ldots, 2^{N-M-P_k - \ldots - P_1} = 2^L$ (respectively).

The least significant level is associated to the resistor string, it is controlled by sub-word $d_L$ of length L and its weight in the transfer function, normalized to $V_{LSB}$, is $2^{N-M-P_k - \ldots - P_1 - L} = 1$.

As a result, the total resolution N of the generalized DAC is given by (56) and $d_{IN}$ can be expressed by (57), where the decimal equivalent of the digital words is applied.

$$N = M + P_k + \ldots + P_1 + L \quad (56)$$

$$d_{IN} = d_M \cdot 2^{P_k + \ldots + P_1 + L} + d_{PK} \cdot 2^{P_{k-1} + \ldots + P_1 + L} + \ldots + d_{P1} \cdot 2^L + d_L \quad (57)$$

In the general case, the significant currents are given by (where the decimal equivalent of the digital words is applied):

$$I_M = d_M \cdot I \quad (58)$$

$$\Delta I_{Pj} = \frac{I}{2^{P_K + \ldots + P_j}}, 1 \leq j \leq k \quad (59)$$

$$I_{Pj} = d_{Pj} \cdot \Delta I_{Pj}, 1 \leq j \leq k \quad (60)$$

$$I_L = \Delta I_{P1} = \frac{I}{2^{P_K + \ldots + P_1}} \quad (61)$$

Consequently, the generic transfer function is (where the decimal equivalent of the digital words is applied):

$$V_{DAC} = 2^L \cdot \left( d_M + \frac{d_{PK}}{2^{P_K}} + \ldots + \frac{d_{P1}}{w^{P_K + \ldots + P_1}} \right) \cdot I \cdot R + \frac{d_L \cdot I \cdot R}{2^{P_K + \ldots + P_1}} \quad (62)$$

Rearranging (62), the expected transfer function is obtained, where $V_{LSB}$ can be identified as the expression given by (64).

$$V_{DAC} = (d_M \cdot 2^{P_K+\ldots+P_1+L} + d_{PK} \cdot 2^{P_{K-1}+\ldots+P_1+L} + \ldots + d_{P1} \cdot 2^L + d_L) \cdot \quad (63)$$

$$\frac{I \cdot R}{2^{P_K+\ldots+P_1}}$$

$$V_{LSB} = \frac{I \cdot R}{2^{P_K+\ldots+P_1}} \quad (64)$$

In general, increasing the levels of segmentation s allows reducing the area for a given resolution N. Following the approach described offers the possibility of implementing s>3 while keeping the desired features of the basic second form of the present invention (previously justified). For each additional level of segmentation, a current divider is added in series; hence, the associated costs are:

Increasing the required headroom $V_H = V_{DD} - V_{DAC}$ to accommodate the operation of the additional current divider.

Including 2 additional OA's associated to the cascoding regulation of the additional current divider (which means an increase in the power consumption and a reduction of the area saved by increasing s).

(Potentially) Increasing the design value of I in order to guarantee that the k consecutive current subdivisions do not produce a current level $\Delta I_{P1}$ in the last current divider comparable to the leakage, which would potentially impact negatively the accuracy.

Consequently, a trade-off between increasing the levels of segmentation and, mainly, headroom and power consumption exists.

The required headroom $V_H$ measured from $V_{DD}$ to $V_{DAC}$ is formed by the following components (see FIG. 19):

The source-drain voltage $\Delta V_I$ of the current source PMOS.
k=s−2 source-drain voltage $\Delta V_P$ of the k current divider PMOS in series (assumed equal for simplicity).
k+1 voltage drop $\Delta V_{SW}$ associated to the switches of the current sources and the k current dividers (assumed equal for simplicity).
The source-drain voltage drop $\Delta V_{CAS}$ of the regulated cascode PMOS directly connected to $V_{DAC}$ (the rest of cascodes are in parallel to a current divider, thus not contributing to the headroom).
The voltage drop associated to the resistor string switches ($\Delta V_{SW-R}$).
The total $V_H$ is, for the general case:

$$V_H = \Delta V_I + k \cdot \Delta V_P + (k+1) \cdot \Delta V_{SW} + \Delta V_{CAS} + \Delta V_{SW-R} \quad (65)$$

Particularizing (65) for the second basic form of this embodiment (where s=k+2=3 and k=1) gives a required headroom of $V_H = \Delta V_I + \Delta V_P + 2 \cdot \Delta V_{SW} + \Delta V_{CAS} + \Delta V_{SW-R}$.

From (67), the additional headroom $\Delta V_H$ required to increase $\Delta k$ levels of segmentation is $\Delta V_H = \Delta k \cdot (\Delta V_P + \Delta V_{SW})$; hence, increasing s by 1 ($\Delta k = 1$) involves increasing the required headroom by $\Delta V_H = \Delta V_P + \Delta V_{SW}$ (obviously, it matches the voltage drop associated to one current divider).

From FIG. 19, the following component count can be computed (for s=k+2 levels of segmentation):

Current source MOS $M_I$: $\#[M_I] = 2^M$.
Current divider MOS $M_{Pj}$: $\#[M_{Pj}] = 2^{P_K} + \ldots + 2^{P_1}$.
Switches: $\#[SW] = 2^L + 3 \cdot (2^{P_K} + \ldots + 2^{P_1} + 2^M)$, where the 3-way switches are counted as 3 switches.
Resistors R in the string: $\#[R] = 2^L$.
Regulated cascode buffers $OA_X$: $\#[OA_X] = 2 \cdot (k+1)$.

Again, these figures reflect the potential for area reduction offered by the present disclosure.

FINAL REMARKS

In a properly designed DAC core according to the present disclosure, the accuracy is limited by components matching and the dynamics are dominated by the switching sequence and timing of current sources. This fact allows optimizing (or at least the adjustment of) the static and dynamic performance independently (once the number of levels and the sharing out of the segmentation has been established), contrary to the majority of segmented DAC's reported in the literature, for which the static and dynamic performance are closely (and unattractively) linked.

The enumerated advantages make the presented DAC suitable for a wide range of applications. It would be especially competitive in high resolution applications where the monotonicity is paramount and/or the load to be driven is glitch sensitive. If the linearity is important, preforming a calibration may be required (several methods are known to the skilled person).

The presented DAC is appropriate to be integrated as part of an Integrated Circuit (IC), in particular, by means of Complementary-Metal-Oxide-Semiconductor (CMOS) technology.

The good dynamics and the fact that, in the preferred embodiment, the biasing voltages of the DAC core are connected to the gates of MOS transistors (thus, isolating the DAC core form the reference circuitry) make the presented invention suitable for multichannel parts with excellent crosstalk, even sharing the reference circuit.

It is thus possible to provide a linear voltage Continuous-Time DAC featuring one or more of the following advantages:

1) Multiple levels of segmentation (s≥3), which may lead to a large area saving.
2) Inherent monotonicity.
3) Potentially, excellent dynamics (in particular, glitch area).
4) Power consumption independent of the input (reducing the potential crosstalk).
5) High degree of flexibility (a given input code can be converted in several ways), which allows the implementation of error correction techniques.
6) The linearity is insensitive, or substantially insensitive, to switch on impedance, amplifiers offset, ground track impedance and other second-order effects.

The fact that the DAC architecture described offers, simultaneously, more than 2 levels of segmentation, inherent monotonicity and good dynamics can be considered an improvement in the state-of-the-art.

In the embodiments described above, the typical linear DAC conversion was assumed to be the desired transfer function between $V_{DAC}$ (or $V_{OUT}$) and $d_{IN}$. However, the DAC can be adapted to provide other transfer functions without departing from the spirit of the present invention. This can be accomplished by properly modifying the decoding logic, and/or the weighting factors of different digital sub-words; alternatively or additionally, a different scaling of the matched current sources, current divider cells and/or resistors in the resistor string can be considered.

A preferred technique to buffer $V_{DAC}$ (thus, generating $V_{OUT}$) was described as part of the presented embodiments. Other approaches, known in the state of the art, are possible to provide, instead of an amplified signal, an attenuated signal as the overall output; additionally, or alternatively, the overall output can be delivered as a different electrical magnitude, instead of a voltage.

In the embodiments, the current sources, the current divider cells and the cascodes are implemented by MOS transistors. In general, a substitutive component, like the Bipolar-Junction-Transistor (BJT), may be used as part of some or all these sub-blocks. Other techniques to increase the output impedance of the current sources and/or the current divider(s), instead of or in addition to cascoding, can be used without departing from the spirit of the present invention.

Other techniques to perform the current division different from the described embodiment may be used without departing from the spirit of the present invention. In particular, an active approach can be considered instead of the described passive approach. For the low headroom embodiment, the current to be couple to the resistor string is developed in parallel to the resistor string (instead of in series, as in the preferred embodiment) and then it is conveyed by mirroring. The implementation of the mirroring operation can be done according to several techniques without departing from the concept.

The current sources can be implemented according to several topologies known in the state-of-the-art (for instance, degeneration may be introduced to increase the matching at the cost of headroom) without departing from the spirit of the present invention.

The polarity of the currents in the DAC core can be inverted by considering current sinks instead of current sources, and adapting the current divider(s) and the biasing of the resistor string accordingly.

The presented preferred embodiment of the resistor string is based on resistors. However, other resistive elements (like diodes) can be used instead of resistors provided that they are able to comply with a desired matching relation.

As it is known in the art, several digital coding systems exist which may be used to generate the input word, and the decoding logic of the presented DAC may be adapted to handle input words generated by any of the coding systems. Thus, for example, the ratio between the matched devices may be adjusted to account for other coding systems which differ from the thermometric coding system described so far.

The presented DAC (or its core) can be used as a sub-DAC in a more complex converter, thus providing an intermediate signal instead of the overall output.

Current mirroring can be used to operatively couple currents from one segment to another without the segments being in direct connection. The terms coupled and operatively coupled are to be construed as including the use of intermediate components such as cascode transistors or current mirrors to achieve improved linearity or headroom in real world circuits.

In the operation of the segmented DAC, it can be observed that:

1) There is provided a method of controlling a segmented DAC having first, second and third segments. The first segment is formed by a string of S1 resistors. The second segment of the DAC generates a current S2.I, where a current I is directed towards the third segment. A current A.I is directed towards a Cth tap (where $0 \leq C \leq S1$) of the first segment. A current B.I is directed towards a tap immediately preceding or immediately following the Cth tap (C−1 or C+1).
2) The sum of the current AI and BI is equal to (S2−1)I.
3) In the method as set out in observations 1 or 2 above, an increase in the value of the input word to be converted (such as an increment) results in a more current (such as +dI in the case of an increment) being diverted to the most significant of the active nodes (the C+1th node) of the first segment.
4) In the method as set out in the preceding observations, a decrease in the value of the input word to be converted (for example decremented by one) results in one of the current steering circuits of the third segment being operated to divert current from the C+1th node to the Cth node of the first segment.
5) In the method as set out in any of the observations 1 to 4 above, when the value dL of the third segment reaches a maximum value, such that all of the current is diverted to the C+1th node of the first segment. The current source, the Eth current source, of the second segment that had been connected to the third segment, becomes connected to the C+1th node of the first segment.
6) In the method of observation 5, once the Eth current source has been connected to the C+1th node of the first segment the current steering circuits of the third segment are set to divert current to the Cth node of the first segment, and another one of the current sources of the second segment is switched to provide its current to the third segment.
7) In the method as set out in any of the preceding observations, an increment in the value of the control word for the second segment causes current from one of the current sources to be diverted from the Cth node to the C+1th node of the first segment.
8) In the method as set out in observation 7, once all the currents A or B from the second segment are diverted to the C+1th node AND all of the current from the third and any subsequent segments is diverted to the C+1th node, the switch to the Cth node can be opened (high impedance) and the switch to the C+2th node closed. Thus, in effect the value of C is incremented.
9) In the method of any of the above observations the control logic according to the method can be exercised and set out in logic or memory such that for any arbitrary input word, the correct control words for the first, second and third segments are selected.
10) The method of any of the preceding observations in which a similar current diversions, but from node C+1 to C or from node C to C−1 as appropriate are performed when the segments, either alone or in combination, reach minimum values.
11) In the method of any of the preceding observations, a control word dm for the segment converting the most significant part of the input word is calculated from an input word $d_{IN}$ by dm=integer part of $d_{IN}/2^{N-M}$ where N is the length of the input word and M is the number of bits converted by the first segment.
12) In the method of observation 11, the first segment is a resistor string DAC having a plurality of nodes, and only two nodes have current supplied to them at any time, the nodes being consecutive (for example, on opposing sides of a resistor of value R).
13) A method as set out in any of the preceding observations, where the control word for the second segment follows the logic set out in table 2 or 3 depending on whether a control word dm is even or odd.
14) A method as set out in any of the preceding observations, where the control word for the third segment follows the logic set out in table 4 or 5 depending on whether a control word dl is even or odd.
15) In a method where the second segment (as shown in FIG. 3) represents the most significant sub-DAC, the current divider/third segment represents the second most significant sub-DAC, and the resistor string represents the least significant sub-DAC, the sub-DACs are controlled such that once a current from the second segment has been directed to node S of the resistor string (dL is a maximum) this current is diverted to node S+1 for an increase in din.

16) A method as set out in observation 15 where the value of Ip gets increased as the current from the second stage is directed to the bottom node $G_{ND}$ of the resistor string.

It is thus possible to provide control strategies for use with the segmented digital to analog converters disclosed herein.

The invention claimed is:

1. A segmented digital to analog converter comprising first, second and third segments, wherein:
   the first segment (DAC1) comprises a plurality of impedances (52.1 to 52.S1) arranged in series;
   the second segment (DAC2) comprises a plurality of current sources (62.1 to 62.S3) or a current divider;
   the third segment (DAC3) comprises a current divider (72); and
   a controller (20) arranged to receive an input digital word and to provide first, second and third control words to the first, second and third segments, respectively, such that the first second and third segments cooperate to provide an analog representation of the input digital word.

2. A segmented digital to analog converter as claimed in claim 1, in which the first segment comprises S1 substantially matched resistances (52.1 to 52.S1) arranged in series and S1+1 (54.0 to 54.S1) switches, each having first and second terminals, the S1 series connected resistances defining 1+S1 nodes (56.0 to 56.S1) labelled 0 to S1, and where the 0th node is connected to a first reference voltage, and each of the 0th to S1th nodes are in communication with the second terminals of a respective one of the switches.

3. A segmented digital to analog converter as claimed in claim 2 where S1 is equal to $2^M$, where M is an integer.

4. A segmented digital to analog converter as claimed in claim 2, in which the first terminals of the even numbered ones of the switches (54.0, 54.2, 54.4, ...) are connected to a first shared switch node (110), and the first terminals of the even numbered ones of the switches (54.1, 54.3, 54.5, ...) are connected to a second shared switch node (112).

5. A segmented digital to analog converter as claimed in claim 4, in which:
   the second segment comprises a current source array and a current steering circuit, the second segment having three outputs and being operable to control current flow at the first, second and third outputs thereof in response to a second segment control word;
   the third segment is a current steering digital to analog converter having two outputs and comprising a current divider and a current steering circuit, and is operable to control a ratio of current flow at the first and second outputs in response to a third segment control word; and
   the first output of the second segment is arranged to supply a current input of the third segment; a second output of the second segment is operably connected to one of the first and second shared nodes and the third output of the second segment is operably connected to the other one of the first and second shared nodes; and
   the first output of the third segment is operably connected to one of the first and second shared nodes and the second output of the third segment is operably connected to the other one of the first and second shared nodes.

6. A segmented digital to analog converter as claimed in claim 1, in which the second segment comprises at least one current source and a current control network such that current can be selectively sent to at least first and second segment output nodes.

7. A segmented digital to analog converter as claimed in claim 6, in which the second segment comprises S3 current sources each with a respective current steering circuit to direct the current from each one of the current sources to the second segment output nodes.

8. A segmented digital to analog converter as claimed in claim 1 in which at least one of the second and third segments has a current input for receiving an input current and further comprises a current divider to divide the input current into portions and a current steering circuit operable to selectively send portions of the input current to at least first and second outputs in response to a control word.

9. A segmented digital to analog converter as claimed in claim 1, in which the resistor string is the main sub-DAC which converts the most significant part of the input word.

10. A segmented digital to analog converter as claimed in claim 1, in which the controller (20) is arranged to such that once the current steering circuit of the third segment (DAC3) is steering all of the current from a current source (62) to one output node (110, 112), and as a response to the increase of the digital input by 1 code, the controller (20) disconnects that current source (62) which had been providing all of the current to the third segment from the third segment and connects the current source to the resistor string thereby changing the value of the intermediate word (dp) by one, and a subsequent current source is connected to the third segment, and the outputs of the third segment are diverted to a node of the first segment where the current now being divided by the third segment had previously been in current flow communication.

11. A segmented digital to analog converter as claimed in claim 10, in which the controller (20) is arranged to such that once the value of the control word (dp) for the second segment (DAC2) is at a maximum or minimum value, the value of the control word dm is incremented or decremented as a response to the increase or decrease of the digital input by 1 code, respectively, and the lower or upper tap, respectively, of the resistor string in the first segment (DAC1) is opened and an adjacent (subsequent or preceding, respectively) tap is closed.

12. A segmented digital to analog converter as claimed in claim 10 in which a number of current sources J1 and J2 connected to the first and second shared nodes are given by J1=dp and J2=$2^P$-1-dp or vice versa.

13. A segmented digital to analog converter as claimed in claim 1 in which at least one of the second and third segments is associated with at least one cascode transistor.

14. A segmented digital to analog converter as claimed in claim 13 further comprising switches operable to supply a current to the at least one cascode transistor to maintain the at least one cascode transistor in proper operating conditions irrespective of the digital code being converted.

15. A segmented digital to analog converter as claimed in claim 14 in which "dummy currents" are created by current sources, and are operable to be supplied to the cascode that would otherwise be non-conducting when an associated segment is either at zero or at a full scale value.

16. A segmented digital to analog converter as claimed in claim 1, in which bias voltages for biasing at least one of : a) current sources of the second segment; and b) the current divider of the third segment; are formed by passing a current through a reference resistor, where the reference resistor is formed of the same material as the resistors of the first segment.

17. A segmented digital to analog converter as claimed in claim 1, in which the second segment is the main sub-DAC that converts the most significant part of the input word.

18. A segmented digital to analog converter as claimed in claim 17, in which the second segment has a first output node operably connected to an output node of the digital to analog converter, and the series connected impedances of the first segment are operably connected between the output node of the digital to analog converter and a node at a reference voltage; and a second output of the second segment is arranged to provide current to the third segment.

19. A segmented digital to analog converter as claimed in claim 18, in which the third segment has a first output operatively connected to the output node of the digital to analog converter; and a second output arranged to supply current to a selected tap of a plurality of taps in the series connected impedances of the first segment.

20. A segmented digital to analog converter as claimed in claim 18, in which the second and third segments each have a third output coupled to the reference voltage of the first segment.

21. A segmented digital to analog converter as claimed in claim 17 further comprising switches operable to supply a current to the at least one cascode transistor to maintain the at least one cascode transistor in proper operating conditions irrespective of the digital code being converted.

22. A segmented digital to analog converter as claimed in claim 1 comprising at least one further segment.

23. A segmented digital to analog converter as claimed in claim 1, on which the digital to analog converter is monotonic in use.

24. A segmented digital to analog converter as claimed in claim 1, further comprising an output buffer or an output amplifier.

* * * * *